(12) United States Patent
Makihara et al.

(10) Patent No.: US 7,692,491 B2
(45) Date of Patent: Apr. 6, 2010

(54) RADIO-FREQUENCY POWER AMPLIFIER

(75) Inventors: Hirokazu Makihara, Osaka (JP);
Haruhiko Koizumi, Osaka (JP); Kazuki Tateoka, Kyoto (JP); Masahiko Inamori, Osaka (JP); Shingo Matsuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 24 days.

(21) Appl. No.: 12/102,317

(22) Filed: Apr. 14, 2008

(65) Prior Publication Data
US 2008/0297260 A1 Dec. 4, 2008

(30) Foreign Application Priority Data
May 28, 2007 (JP) ............... 2007-140911

(51) Int. Cl.
*H03F 1/52* (2006.01)
(52) U.S. Cl. ............ 330/298; 330/207 P; 330/310
(58) Field of Classification Search ............ 330/207 P, 330/298, 310
See application file for complete search history.

(56) References Cited
U.S. PATENT DOCUMENTS
6,278,328 B1 * 8/2001 Yamamoto et al. ......... 330/298
7,145,397 B2 * 12/2006 Yamamoto et al. ......... 330/298
7,486,144 B2 * 2/2009 Mitzlaff et al. ............. 330/298

FOREIGN PATENT DOCUMENTS
JP 2005-064658 3/2005

* cited by examiner

*Primary Examiner*—Khanh V Nguyen
(74) *Attorney, Agent, or Firm*—McDermott Will & Emery LLP

(57) ABSTRACT

A radio-frequency power amplifier for preventing a final-stage HBT from being destroyed is provided. To this end, a radio-frequency multistage power amplifier of the present invention includes: a first amplification stage having a first hetero bipolar transistor of which collector output is detected; a second amplification stage which is prior to the first amplification stage and which has a second hetero bipolar transistor in which the detection result is reflected; a first resistor provided between a collector of the second hetero bipolar transistor and a power supply; and a protection circuit which is connected between a collector of the first hetero bipolar transistor and the collector of the second hetero bipolar transistor, detects output from the collector of the first hetero bipolar transistor, and reduces a voltage of the collector of the second hetero bipolar transistor in accordance with the detected output.

13 Claims, 17 Drawing Sheets

DYNAMIC LOAD LINE OF HBT2 AT TIME OF LOAD MISMATCH

DYNAMIC LOAD LINE OF HBT1

DYNAMIC LOAD LINE OF HBT2 AT TIME OF LOAD MISMATCH

DYNAMIC LOAD LINE OF HBT1

DYNAMIC LOAD LINE OF HBT2 AT TIME OF LOAD MISMATCH

OUTPUT POWER OF HBT2

F I G. 9
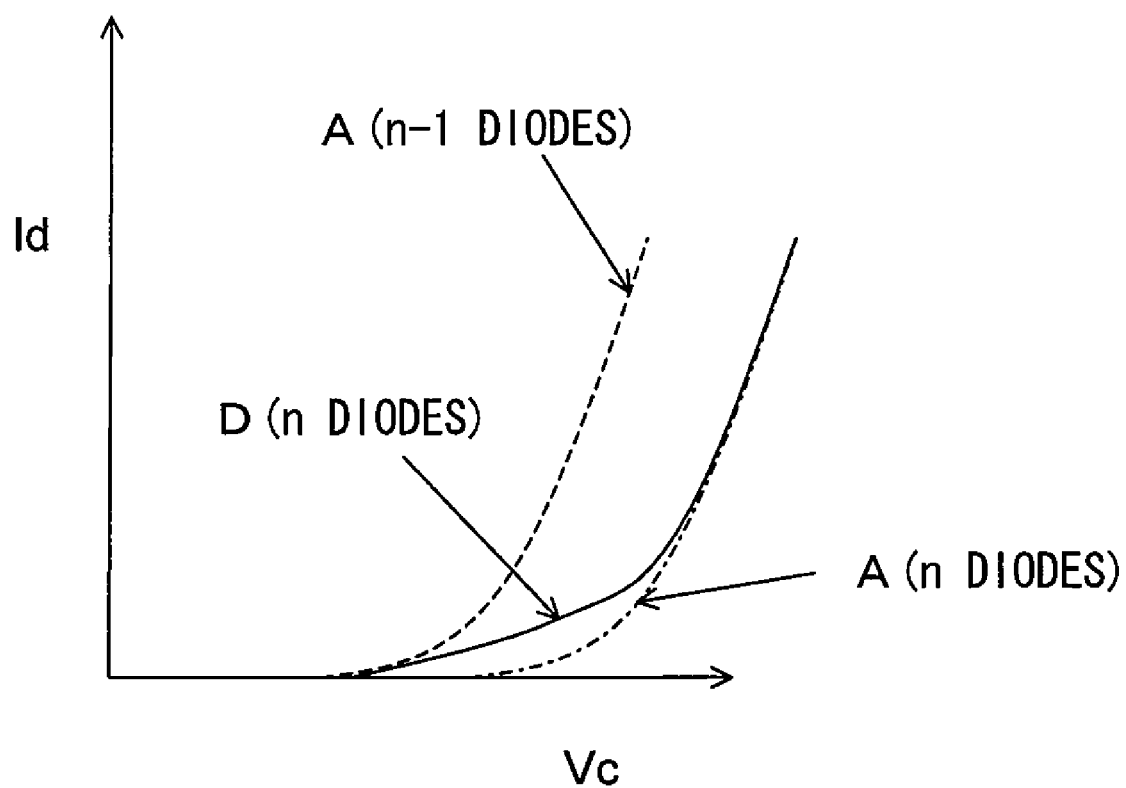

OUTPUT POWER OF HBT2

OUTPUT POWER OF HBT2

DYNAMIC LOAD LINE AND SAFE OPERATING AREA OF
HBT AT TIME OF LOAD MISMATCH

DYNAMIC LOAD LINE AND SAFE OPERATING AREA OF
FINAL-STAGE HBT AT TIME OF LOAD MISMATCH

DYNAMIC LOAD LINE OF FIRST-STAGE HBT

DYNAMIC LOAD LINE AND SAFE OPERATING AREA OF FINAL-STAGE HBT AT TIME OF LOAD MISMATCH

DYNAMIC LOAD LINE OF FIRST-STAGE HBT

DYNAMIC LOAD LINE AND SAFE OPERATING AREA OF
FINAL-STAGE HBT AT TIME OF LOAD MISMATCH

OUTPUT POWER OF FINAL-STAGE HBT OF TWO-STAGE
POWER AMPLIFIER EMPLOYING CONVENTIONAL ART

RADIO-FREQUENCY POWER AMPLIFIER

BACKGROUND OF THE INVENTION

1. Field of the Invention

The present invention relates to a radio-frequency power amplifier using a transistor, and particularly to a radio-frequency power amplifier including a protection circuit.

2. Description of the Background Art

A radio-frequency power amplifier of a mobile communication terminal such as a mobile phone includes a multistage amplifier using, for two to three stages, transistors made of compound semiconductors. Further, in recent years, as a device for an amplifier, a hetero bipolar transistor (hereinafter referred to as an "HBT") capable of single power supply operation is mainly used. The HBT has the advantage of having higher power density per unit area than that of a field effect transistor and thus being reducible in size, but also has the problem of having lower ruggedness at the time of load mismatch than that of the field effect transistor.

The ruggedness at the time of load mismatch will be described below. Mobile communication terminals of a GSM (Global System for Mobile Communications), which is the world's currently most common mobile phone communication system, and some mobile communication terminals of a UMTS (Universal Mobile Telecommunications System), which has recently started to become common, do not use an isolator for stabilizing the load impedance of a radio-frequency power amplifier, due to reducing the mobile communication terminals in size and the like. Consequently, when a termination condition of an antenna changes, a load condition of the radio-frequency power amplifier also changes.

FIG. 21 is a general diagram showing a dynamic load line and a safe operating area at the time of load mismatch, of the HBT. In FIG. 21, Ic represents a collector current and Vc represents a collector voltage. In FIG. 21, when the load condition changes, the dynamic load line changes significantly. Then, the HBT is destroyed when the dynamic load line of the HBT goes beyond the safe operating area, i.e., reaches a thermal destruction area or a breakdown-voltage destruction area. More specifically, the HBT is thermally destroyed when the dynamic load line exceeds a thermally safe operating limit, and the HBT is breakdown-voltage-destroyed when the dynamic load line exceeds a breakdown voltage limit.

FIG. 22 is a diagram showing the dynamic load line at the time of load mismatch, of a final-stage HBT which is included in a multistage amplifier and to which the collector voltage exceeding a rated value is applied (hereinafter referred to as an "overvoltage condition") due to the change of a power supply voltage and the like. As shown in FIG. 22, in an overvoltage condition, the dynamic load line shifts in the direction of increasing the voltage (Vc) and breakdown-voltage destruction is caused. To prevent such destruction at the time of load mismatch in the overvoltage condition from occurring, a method is proposed for limiting the input power to a final-stage HBT, by incorporating a protection circuit which senses the collector voltage of the final-stage HBT and reduces the base voltage of a first-stage HBT in the overvoltage condition (see Japanese Laid-Open Patent Publication No. 2005-64658).

FIG. 23 is a diagram showing the dynamic load line of the first-stage HBT which is included in the multistage amplifier and of which the base voltage is reduced by the above-described protection circuit. As shown in FIG. 23, the base voltage is reduced, whereby the dynamic load line of the first-stage HBT shifts in the direction of reducing the collector current (Ic). Consequently, the output power of the first-stage HBT is reduced, and thus the power inputted to the final-stage HBT is reduced. FIG. 24 is a diagram showing the dynamic load line at the time of load mismatch, of the final-stage HBT, in the case where, in the overvoltage condition, the base voltage of the first-stage HBT is reduced by the protection circuit and thus the input power to the final-stage HBT is reduced. As shown in FIG. 24, the input power to the final-stage HBT is reduced, whereby the dynamic load line of the final-stage HBT becomes smaller. Consequently, the dynamic load line of the final-stage HBT does not go beyond the safe operating area, thus it is possible to prevent the final-stage HBT from being destroyed.

However, the method disclosed in Japanese Laid-Open Patent Publication No. 2005-64658 has the following problem. FIG. 25 is a diagram showing the dynamic load line of the first-stage HBT of which the base voltage is reduced by the protection circuit and to the base of which a radio-frequency signal exceeding the rated power is then inputted. As shown in FIG. 25, when the radio-frequency signal exceeding the rated power is inputted to the base of the first-stage HBT (hereinafter referred to as "at the time of excessive input"), the dynamic load line of the first-stage HBT shifts in the direction of increasing the collector current and also becomes larger due to the increase of the input power thereto. That is, the output power of the first-stage HBT is increased. This results from a phenomenon that the base voltage of the first-stage HBT is increased due to a voltage swing of the radio-frequency signal inputted thereto. FIG. 26 is a diagram showing the dynamic load line at the time of load mismatch, of the final-stage HBT, in the case where the dynamic load line of the first-stage HBT shifts in the direction of increasing the collector current in FIG. 25. Since the output power of the first-stage HBT cannot be reduced when the first-stage HBT is at the time of excessive input (see FIG. 25), the input power to the final-stage HBT is not reduced. Therefore, as shown in FIG. 26, the dynamic load line at the time of load mismatch, of the final-stage HBT becomes larger, and as a result, the final-stage HBT is destroyed when the dynamic load line goes beyond the safe operating area. As described above, in the method disclosed in Japanese Laid-Open Patent Publication No. 2005-64658, when the base of the first-stage HBT is at the time of excessive input, the output power of the first-stage HBT cannot be reduced even if the base voltage of the first-stage HBT is reduced by the protection circuit, and thus the final-stage HBT may be destroyed.

FIG. 27 is a diagram showing, in a two-stage power amplifier employing the method disclosed in Japanese Laid-Open Patent Publication No. 2005-64658, the output power of a final-stage HBT, in the case where the radio-frequency signal of the rated power is inputted to the base of a first-stage HBT and in the case where the radio-frequency signal exceeding the rated power is inputted thereto. Note that: the operating frequency of the two-stage power amplifier is 0.9 GHz; regarding the device size of the first-stage HBT, the emitter area is 200 um$^2$; regarding the device size of the final-stage HBT, the emitter area is 800 um$^2$; the collector voltage (Vc) of the first-stage HBT is 1.8 V (fixed); the rated collector voltage of the final-stage HBT is 3.5 V; and the input/output impedance of the two-stage power amplifier is matched to 50 Ω by an input/output /interstage matching circuit. As shown in FIG. 27, when the input power (Pin) to the first-stage HBT is 0 dBm, the output power of the first-stage HBT is reduced in the overvoltage condition in which the collector voltage (Vc) of the final-stage HBT exceeds the rated collector voltage of 3.5 V. As a result, the output power (Pout) of the final-stage HBT is reduced. However, it is indicated that when the input power (Pin) to the first-stage HBT is +5 dBm (in an excessive input condition), the output power of the first-stage HBT is not reduced. As a result, in the overvoltage condition in which the collector voltage (Vc) of the final-stage HBT exceeds the rated collector voltage of 3.5 V, the output power (Pout) of the final-stage HBT is increased.

SUMMARY OF THE INVENTION

Therefore, an object of the present invention is to provide a radio-frequency power amplifier which is not destroyed by load mismatch even in the case of excessive input and an overvoltage condition.

The present invention is directed to a radio-frequency multistage power amplifier using hetero bipolar transistors of which emitters are connected to ground. To attain the above-mentioned object, the radio-frequency multistage power amplifier of the present invention includes: a first amplification stage including a first hetero bipolar transistor of which collector output is detected; a second amplification stage which is prior to the first amplification stage and includes a second hetero bipolar transistor in which the detection result is reflected; a first resistor provided between a collector of the second hetero bipolar transistor and a power supply; and a protection circuit which is connected between a collector of the first hetero bipolar transistor and the collector of the second hetero bipolar transistor, detects output from the collector of the first hetero bipolar transistor, and reduces a voltage of the collector of the second hetero bipolar transistor in accordance with the detected output.

Further, it is preferable that the protection circuit includes: a diode circuit having an anode terminal connected to the collector of the first hetero bipolar transistor and also having a cathode terminal; and a third hetero bipolar transistor of which a base is connected to the cathode terminal, a collector is connected to the collector of the second hetero bipolar transistor, and an emitter is connected to ground, and that the protection circuit detects a voltage of the collector of the first hetero bipolar transistor.

Further, it is preferable that the diode circuit has a plurality of diodes series-connected therein.

Further, it is preferable that the protection circuit further includes: a second resistor provided between the anode terminal and the collector of the first hetero bipolar transistor; and a third resistor provided between the collector of the third hetero bipolar transistor and the collector of the second hetero bipolar transistor.

Further, it is preferable that the protection circuit further includes a capacitor of which one end is connected to the base or the collector of the third hetero bipolar transistor and the other end is connected to ground.

Further, it is preferable that the protection circuit further includes an inductor provided between the second resistor and the collector of the first hetero bipolar transistor or between the third resistor and the collector of the second hetero bipolar transistor.

Further, it is preferable that the protection circuit further includes a resistor of which one end is connected to the base of the third hetero bipolar transistor and the other end is connected to ground.

Further, it is preferable that an anode and a cathode of any one of the plurality of diodes included in the diode circuit are connected by a resistor.

Further, it is preferable that a second resistor provided between a base of the second hetero bipolar transistor and a bias power supply is further included, and that the protection circuit is further connected to the base of the second hetero bipolar transistor and further reduces a voltage of the base of the second hetero bipolar transistor in accordance with the collector output.

Further, it is preferable that the protection circuit includes: a diode circuit having an anode terminal connected to the collector of the first hetero bipolar transistor and also having a cathode terminal; a third hetero bipolar transistor of which a base is connected to the cathode terminal, a collector is connected to the collector of the second hetero bipolar transistor, and an emitter is connected to ground; and a fourth hetero bipolar transistor of which a base is connected to the cathode terminal, a collector is connected to the base of the second hetero bipolar transistor, and an emitter is connected to ground, and that the protection circuit detects a voltage of the collector of the first hetero bipolar transistor.

Further, it is preferable that the protection circuit includes: a first capacitor of which one end is connected to the collector of the first hetero bipolar transistor; a diode detector circuit having an input terminal connected to the other end of the first capacitor and also having an output terminal, thereby converting power inputted from the input terminal into a voltage and outputting the voltage from the output terminal; a third hetero bipolar transistor of which a base is connected to the output terminal of the diode detector circuit, a collector is connected to the collector of the second hetero bipolar transistor, and an emitter is connected to ground; and a second resistor which is parallel-connected between the first capacitor and the input terminal of the diode detector circuit and of which one end is connected to ground, and that the protection circuit detects power of the collector of the first hetero bipolar transistor.

Further, it is preferable that the diode detector circuit includes: a diode of which an anode is connected to the input terminal and a cathode is connected to the output terminal; and a third resistor and a second capacitor, each of which is parallel-connected between the cathode of the diode and the output terminal and of each of which one end is connected to ground.

Further, it is preferable that the protection circuit further includes a fourth resistor between the collector of the third hetero bipolar transistor and the collector of the second hetero bipolar transistor.

As described above, based on the present invention, it is possible to provide a radio-frequency power amplifier which is not destroyed even in the case of excessive input and an overvoltage condition.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a diagram illustrating the characteristics (the relationship between a current (Id) flowing through a detection terminal 24 and a collector voltage (Vc) of the HBT 2) of the circuit of (D) of FIG. 8;

FIG. 22 is a diagram showing a dynamic load line at the time of load mismatch, of a final-stage HBT which is included in a multistage amplifier and to which the collector voltage exceeding a rated value is applied due to the change of a power supply voltage and the like;

DESCRIPTION OF THE PREFERRED EMBODIMENTS

First Embodiment

Figure 1:
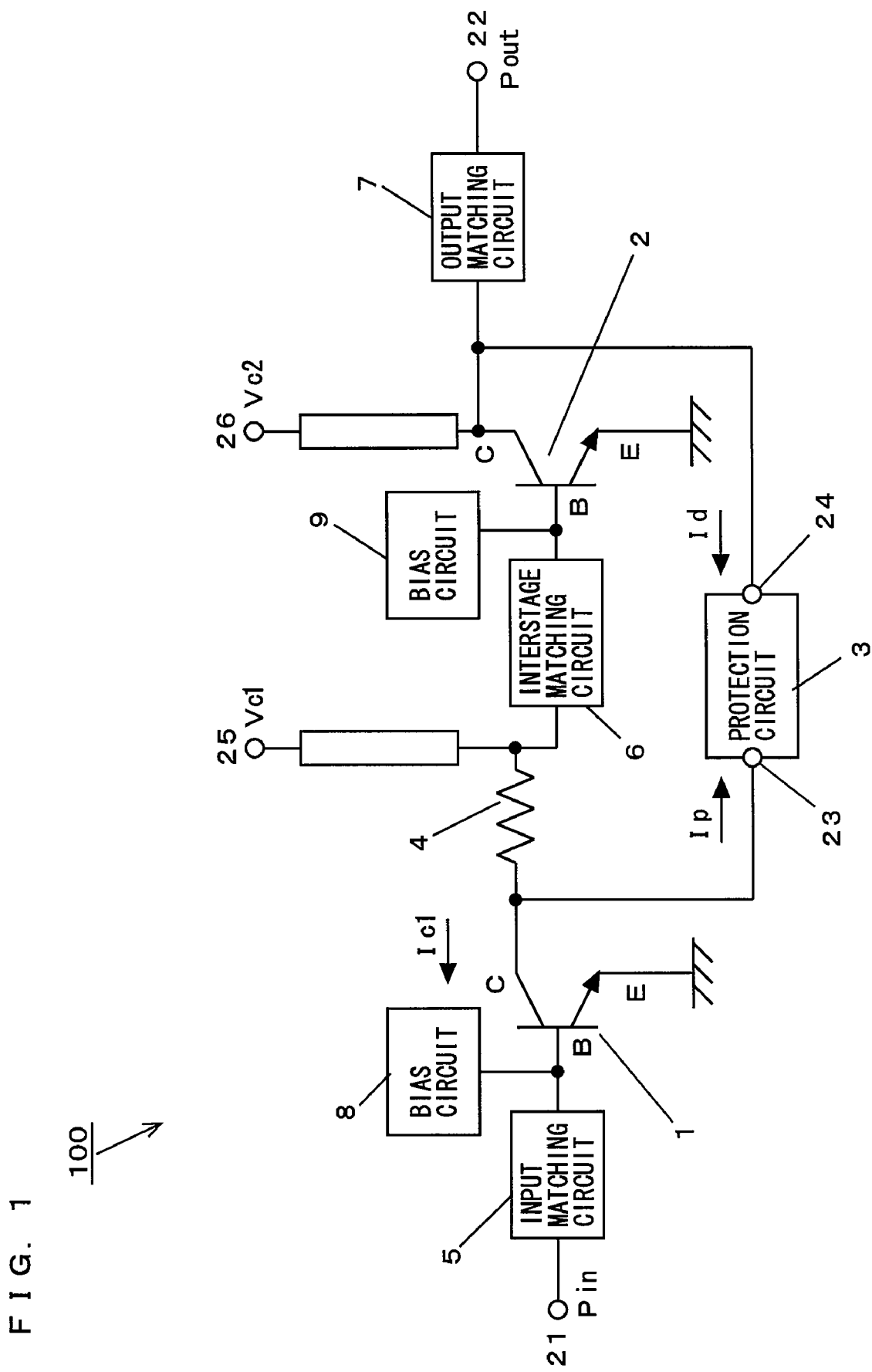
FIG. 1 is a diagram showing an example structure of a radio-frequency power amplifier 100 according to a first embodiment of the present invention.

FIG. 1 is a diagram showing an example structure of a radio-frequency power amplifier 100 according to a first embodiment of the present invention. As shown in FIG. 1, the radio-frequency power amplifier 100 includes an HBT 1, an HBT 2, a protection circuit 3, a resistor 4, an input matching circuit 5, an interstage matching circuit 6, an output matching circuit 7, a bias circuit 8, and a bias circuit 9. The input of the input matching circuit 5 is connected to an input terminal 21, and the output of the input matching circuit 5 is connected to the base of the HBT 1 and to the bias circuit 8. The emitter of the HBT 1 is connected to ground, and the collector of the HBT 1 is connected to the input of the resistor 4. The output of the resistor 4 is connected to the input of the interstage matching circuit 6 and to a power supply voltage terminal 25. The output of the interstage matching circuit 6 is connected to the base of the HBT 2 and to the bias circuit 9. The emitter of the HBT 2 is connected to ground, and the collector of the HBT 2 is connected to the input of the output matching circuit 7 and to a power supply voltage terminal 26. The output of the output matching circuit 7 is connected to an output terminal 22. The protection circuit 3 includes a detection terminal 24, which is connected to the collector of the HBT 2, and also includes a current input terminal 23, which is connected to the collector of the HBT 1.

With reference to FIG. 1, the operation of the radio-frequency power amplifier 100 will be described below. The power (a radio-frequency signal) inputted to the input terminal 21 is inputted to the base of the HBT 1 via the input matching circuit 5. The power inputted to the base of the HBT 1 is amplified and then outputted from the collector of the HBT 1. The power outputted from the collector of the HBT 1 is inputted to the base of the HBT 2 via the resistor 4 and the interstage matching circuit 6. The power inputted to the base of the HBT 2 is amplified and then outputted from the collector of the HBT 2. The power outputted from the collector of the HBT 2 is outputted to the output terminal 22 via the output matching circuit 7. That is, the power inputted to the input terminal 21 is amplified by the HBT 1 and then amplified by the HBT 2.

The protection circuit 3 detects the collector voltage of the HBT 2 via the detection terminal 24. Then, when the detected collector voltage of the HBT 2 exceeds a predetermined value, a current Id flows into the protection circuit 3 from the collector of the HBT 2 via the detection terminal 24. When the current Id flows into the protection circuit 3 via the detection terminal 24, a current Ip flows into the protection circuit 3 from the collector of the HBT 1 via the current input terminal 23. Here, the predetermined value of the collector voltage of the HBT 2 is a voltage value at which the HBT 2 operates within a safe operating area, and also is a voltage value at which the HBT 2 can obtain a desired amplification gain. Further, the current Id has a positive correlation with the excess voltage of the collector voltage exceeding the predetermined value, of the HBT 2. Furthermore, the current Ip has the positive correlation with the current Id. Therefore, the current Ip has the positive correlation with the excess voltage of the collector voltage exceeding the predetermined value, of the HBT 2. Note that hereinafter, a state where the current Ip is flowing into the protection circuit 3 will be referred to as an "on-state" of the protection circuit 3, and a state where the current Ip is not flowing into the protection circuit 3 will be referred to as an "off-state" of the protection circuit 3.

Here, the current flowing into the collector of the HBT 1 is Ic1; the voltage of the collector end of the HBT 1 is Vc1_device; the resistance value of the resistor 4 is R1; and the power supply voltage applied to the power supply voltage terminal 25 is Vc1. In this case, in the off-state of the protection circuit 3, Vc1_device is represented by the following equation 1.

[Equation 1]

$$Vc1\_device = Vc1 - R1 \times Ic1 \quad (1)$$

On the other hand, in the on-state of the protection circuit 3, since the current Ip flows into the protection circuit 3, the current flowing through the resistor 4 is Ic1+Ip. Consequently, Vc1_device is represented by the following equation 2.

[Equation 2]

$$Vc1\_device = Vc1 - R1(Ic1+Ip) = Vc1 - R1 \times Ic1 - R1 \times Ip \quad (2)$$

Equation 1 and equation 2 indicate that the voltage Vc1_device applied to the collector of the HBT 1 in the on-state of the protection circuit 3 drops by R1×Ip from the voltage Vc1_device applied to the collector of the HBT 1 in the off-state of the protection circuit 3.

When the collector voltage (Vc1_device) of the HBT 1 drops, the power outputted from the collector of the HBT 1 is reduced. Consequently, the power inputted to the base of the HBT 2 is reduced, and thus the power outputted from the collector of the HBT 2 is reduced. Then, as has already been described, since the current Ip has the positive correlation with the excess voltage of the collector voltage exceeding the predetermined value, of the HBT 2, the collector voltage of the HBT 1 drops when the excess voltage of the collector voltage exceeding the predetermined value, of the HBT 2 is increased. Thus, the output power of the collector of the HBT 1 is also reduced. As a result, it is possible to prevent the HBT 2 from operating beyond the safe operating area and therefore is possible to prevent the HBT 2 from being destroyed.

Figure 2:
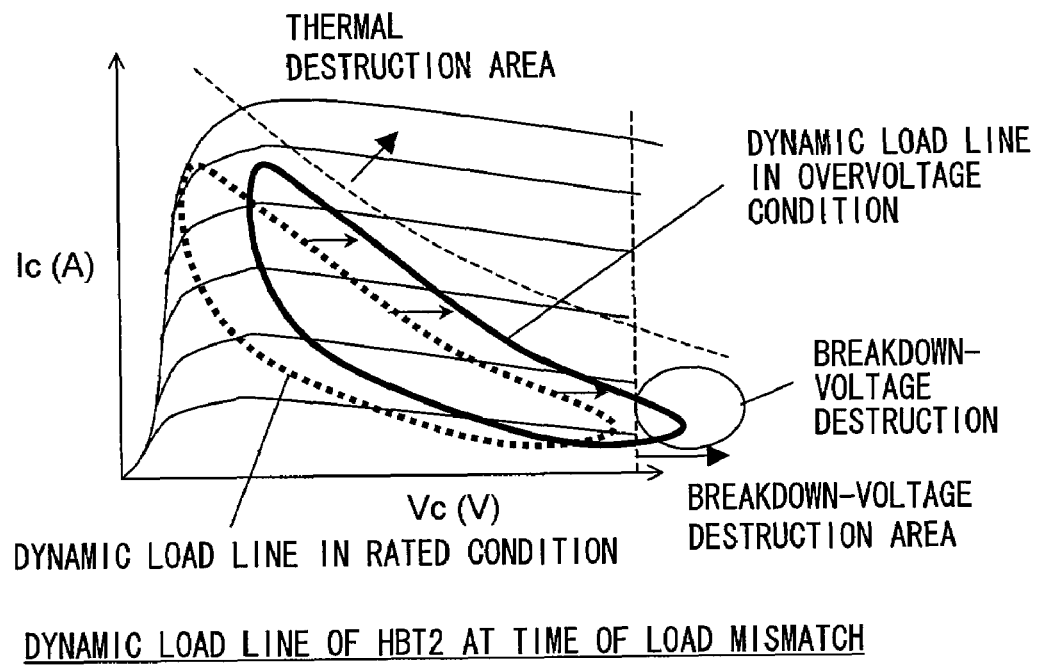
FIG. 2 is a diagram showing a dynamic load line at the time of load mismatch, of an HBT 2.
Figure 3:
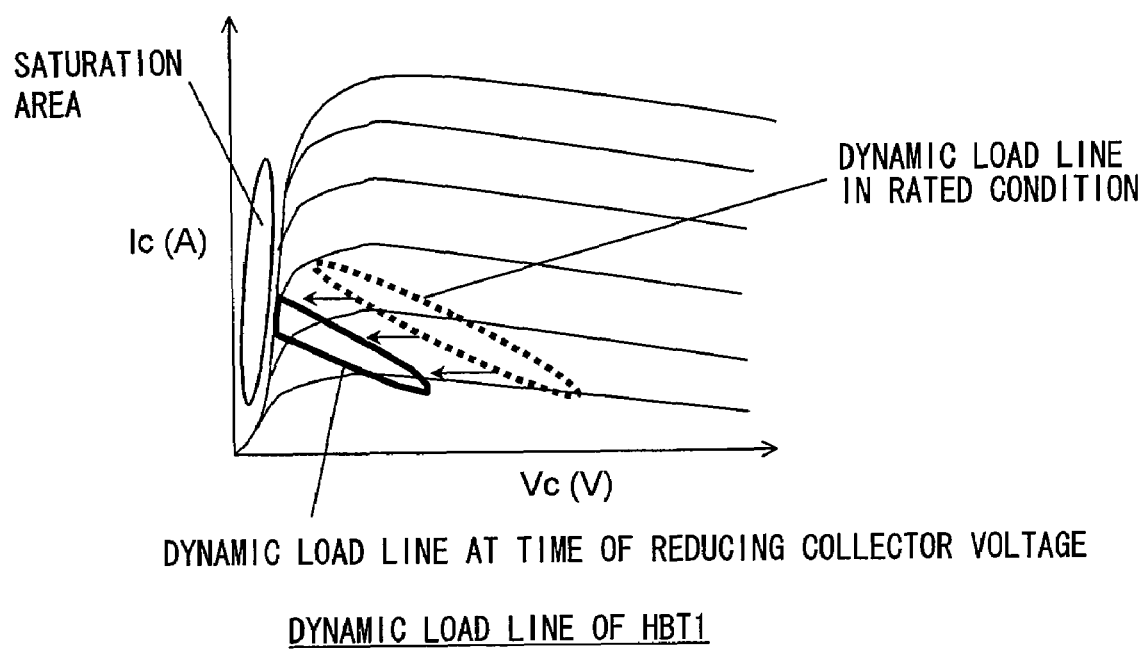
FIG. 3 is a diagram showing a dynamic load line of an HBT 1.
Figure 4:
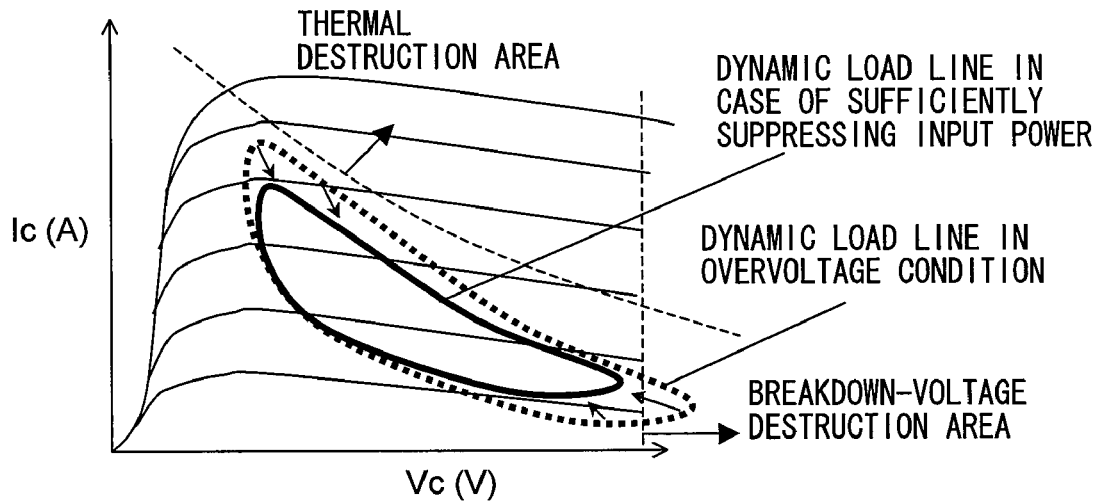
FIG. 4 is a diagram showing the dynamic load line at the time of load mismatch, of the HBT 2.
Figure 5:
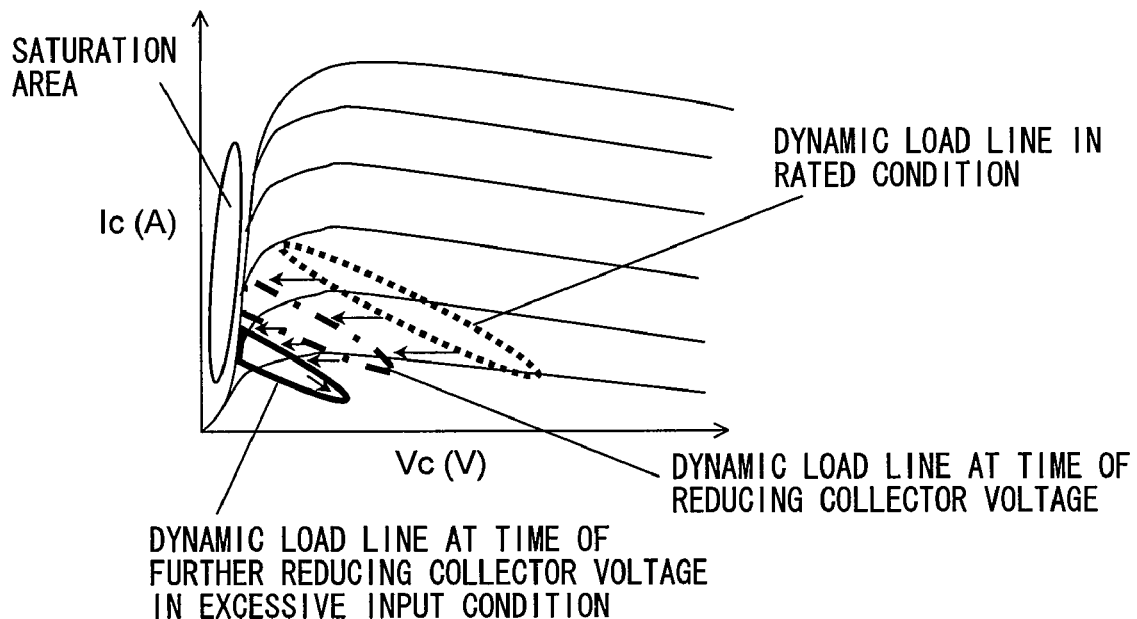
FIG. 5 is a diagram showing the dynamic load line of the HBT 1.
Figure 6:
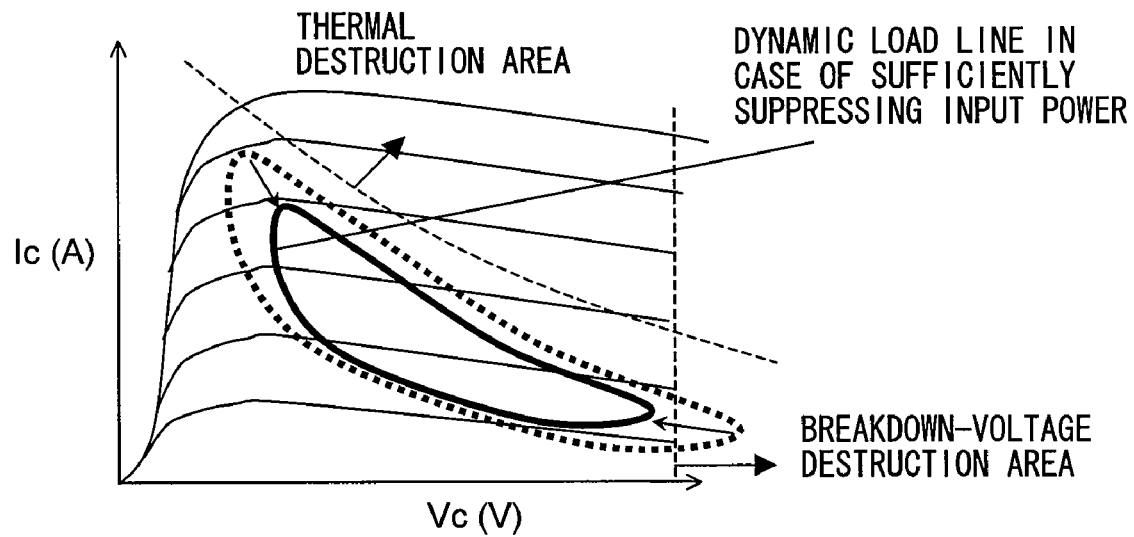
FIG. 6 is a diagram showing the dynamic load line at the time of load mismatch, of the HBT 2.

The operation of the radio-frequency power amplifier 100 will be described in more detail below with reference to a dynamic load line at the time of load mismatch, of the HBT 2 as shown in FIGS. 2, 4 and 6, to a dynamic load line of the HBT 1 as shown in FIGS. 3 and 5, and to FIG. 1. Note that in FIGS. 2 through 6, Vc represents a collector voltage and Ic represents a collector current.

First, described is the case where the power of the radio-frequency signal inputted to the base of the HBT 1 is the rated power. The protection circuit 3 detects the predetermined value of the collector voltage of the HBT 2 via the detection terminal 24, before the dynamic load line at the time of load mismatch, of the HBT 2 shifts in the direction of increasing Vc and goes beyond the safe operating area as shown in FIG. 2, due to an overvoltage condition. Then, the protection circuit 3 enters the on-state and the current Id flows into the protection circuit 3 via the detection terminal 24 (see FIG. 1). When the current Id flows into the protection circuit 3, the current Ip flows into the protection circuit 3 via the current input terminal 23. When the current Ip flows into the protection circuit 3, as has already been described with reference to equation 2, Vc of the HBT 1 is reduced and enters a state shown in FIG. 3 (i.e., the dynamic load line shifts in the direction of reducing Vc). As shown in FIG. 3, since the dynamic load line of the HBT 1 is restricted by the saturation area of an HBT in a state where Vc is reduced, the power outputted from the HBT 1 is reduced. Consequently, the power inputted to the base of the HBT 2 is reduced. When the input power to the HBT 2 is reduced, the dynamic load line of the HBT 2 becomes so small as not to reach destruction areas as shown in FIG. 4. As a result, the HBT 2 is prevented from being destroyed.

Next, described is the case (the time of excessive input) where the power of the radio-frequency signal inputted to the base of the HBT 1 exceeds the rated power. As described above, the protection circuit 3 enters the on-state and reduces the collector voltage Vc of the HBT 1 (see FIG. 3), before the dynamic load line at the time of load mismatch, of the HBT 2 goes beyond the safe operating area (see FIG. 2), due to the overvoltage condition. In this case, when the input power to the base of the HBT 1 is increased and the time of excessive input begins, the collector current Ic1 of the HBT 1 is increased. Here, the resistor 4 is connected between the collector of the HBT 1 and the power supply voltage terminal 25 (see FIG. 1). Therefore, when the collector current Ic1 of the HBT 1 is increased, the voltage of the collector end of the HBT 1 drops more due to the resistor 4 (see equation 2). As shown in FIG. 5, the dynamic load line of the HBT 1 in this case becomes larger in accordance with the increase of the input power to the base of the HBT 1, also shifts further in the direction of reducing Vc, and is further restricted by the saturation area of an HBT. Consequently, it is possible to sufficiently reduce the power outputted from the HBT 1 even in an excessive input condition. When the input power to the HBT 2 is reduced, the dynamic load line of the HBT 2 becomes so small as not to reach the destruction areas as shown in FIG. 6. As a result, the radio-frequency power amplifier 100 according to the first embodiment can sufficiently suppress the output power of the HBT 1 even at the time of excessive input, i.e., even when the power of the radio-frequency signal inputted to the base of the HBT 1 exceeds the rated power, and thus can prevent the HBT 2 from being destroyed.

Figure 7:
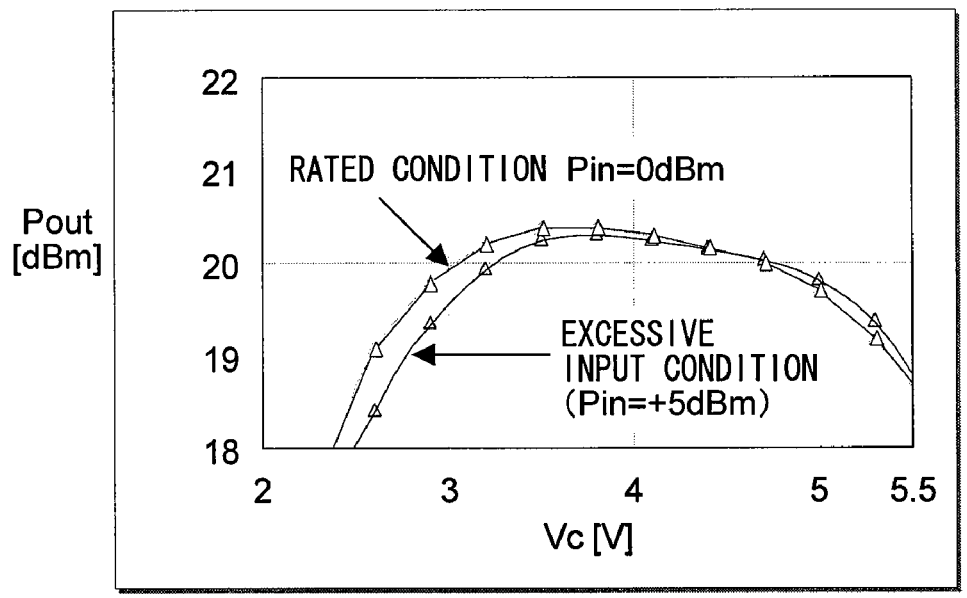
FIG. 7 is a diagram showing the output power of the HBT 2 in the radio-frequency power amplifier 100, in the case where a radio-frequency signal of the rated power is inputted to the base of the HBT 1 and in the case where the radio-frequency signal exceeding the rated power is inputted thereto.
Figure 27:
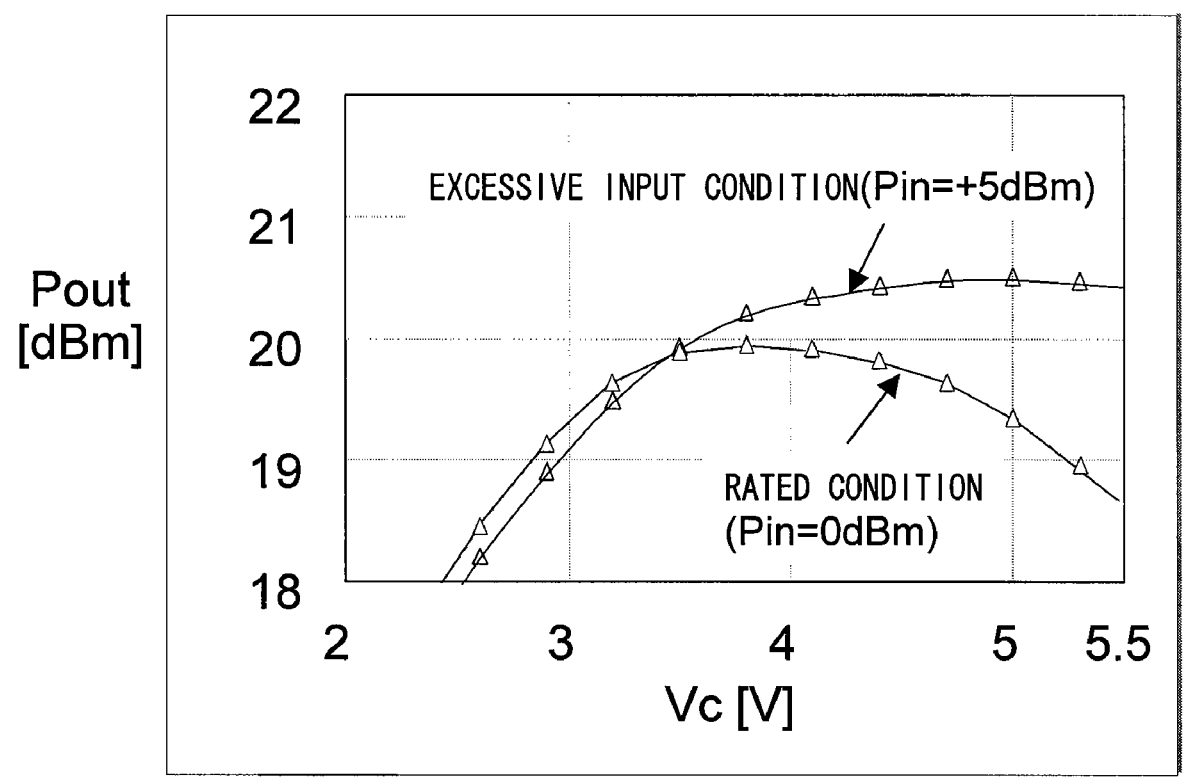
FIG. 27 is a diagram showing, in a two-stage power amplifier employing a method disclosed in Japanese Laid-Open Patent Publication No. 2005-64658, the output power of a final-stage HBT, in the case where the radio-frequency signal of the rated power is inputted to the base of a first-stage HBT and in the case where the radio-frequency signal exceeding the rated power is inputted thereto.

FIG. 7 is a diagram showing the output power of the HBT 2 in the radio-frequency power amplifier 100, in the case where the radio-frequency signal of the rated power is inputted to the base of the HBT 1 and in the case where the radio-frequency signal exceeding the rated power is inputted thereto. Note that conditions such as a device size are the same as those described in FIG. 27. As shown in FIG. 7, it is indicated that similarly to the case where the input power Pin to the base of the HBT 1 is 0 dBm (in a rated input condition), even in the case where the input power Pin to the base of the HBT 2 is +5 dBm (in the excessive input condition), the output power of the HBT 1 is reduced in the overvoltage condition in which the collector voltage Vc of the HBT 2 exceeds the rated voltage of 3.5 V, and as a result, the output power Pout of the HBT 2 is restricted.

Figure 8:
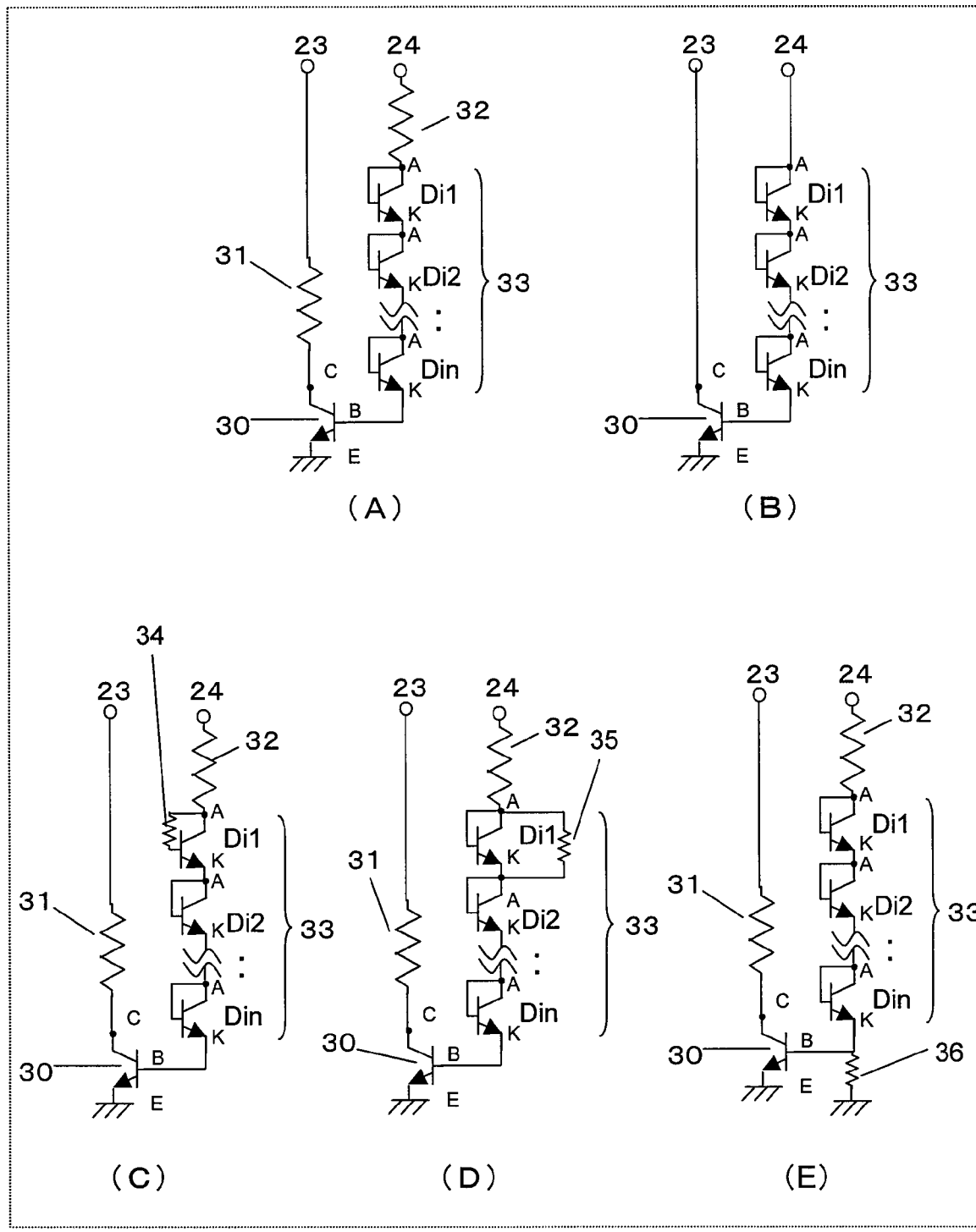
FIG. 8 is a diagram showing example structures of a protection circuit 3.

Specific structures of the protection circuit 3 will be described below. FIG. 8 is a diagram showing example structures of the protection circuit 3. First, (A) of FIG. 8 will be described. As shown in (A) of FIG. 8, the protection circuit 3 includes a diode circuit 33 having series-connected therein one diode Di1 or diodes Di1 through Din (n>1), an HBT 30, a resistor 31, and a resistor 32. The detection terminal 24 is connected to the anode of the diode Di1 via the resistor 32. The cathode of the diode Din is connected to the base of the HBT 30. The emitter of the HBT 30 is connected to ground. The collector of the HBT 30 is connected to the current input terminal 23 via the resistor 31. Here, the threshold voltages of the diodes Di1 through Din are each Vd; the on-voltage between the base and the emitter of the HBT 30 is Vbe; and the number of the series-connected diodes (Din) is n. In this case, when the voltage of the detection terminal 24 exceeds n×Vd+Vbe, the diodes Di1 through Din and the HBT 30 are turned on, and then a current flows into the collector of the HBT 30 via the current input terminal 23. Then, it is possible to control the voltage to turn on the protection circuit 3, by changing the number n of the diodes (Din). Further, the resistor 31 and the resistor 32 each have a function of controlling the sensitivity of the voltage detection and the amount of the current Ip flowing through the current input terminal 23, but can be omitted as shown in (B) of FIG. 8, if unnecessary.

The circuit of (C) of FIG. 8 has a structure in which a resistor 34 connecting the base and the collector of an HBT included in the diode Di1 is added to the circuit structure of (A) of FIG. 8. The circuit of (D) of FIG. 8 has a structure in which a resistor 35 connecting the anode and the cathode of the diode Di1 is added to the circuit structure of (A) of FIG. 8. The circuit of (E) of FIG. 8 has a structure in which a resistor 36 connecting the base of the HBT 30 to ground is added to the circuit structure of (A) of FIG. 8. Due to the structures of (C) through (E) of FIG. 8, the circuits of (C) through (E) of FIG. 8 can control the sensitivity of the voltage detection. FIG. 9 is a diagram illustrating the characteristics (the relationship between the current Id flowing through the detection terminal 24 and the collector voltage Vc of the HBT 2) of the circuit of (D) of FIG. 8. In FIG. 9: a solid line represents the characteristics of the circuit of (D) of FIG. 8, which has n diodes; an alternate long and short dash line represents the characteristics of the circuit of (A) of FIG. 8, which has n diodes; and a dashed line represents the characteristics of the circuit of (A) of FIG. 8, which has n-1 diodes. As shown in FIG. 9, since, in the circuit of (D) of FIG. 8, the current Id starts to flow at the voltage Vc lower than that in the circuit of (A) of FIG. 8, it is possible to gradually turn on the protection circuit. That is, it is possible to reduce voltage detection sensitivity. The circuits of (C) and (E) of FIG. 8 also have the same characteristics.

Figure 10:
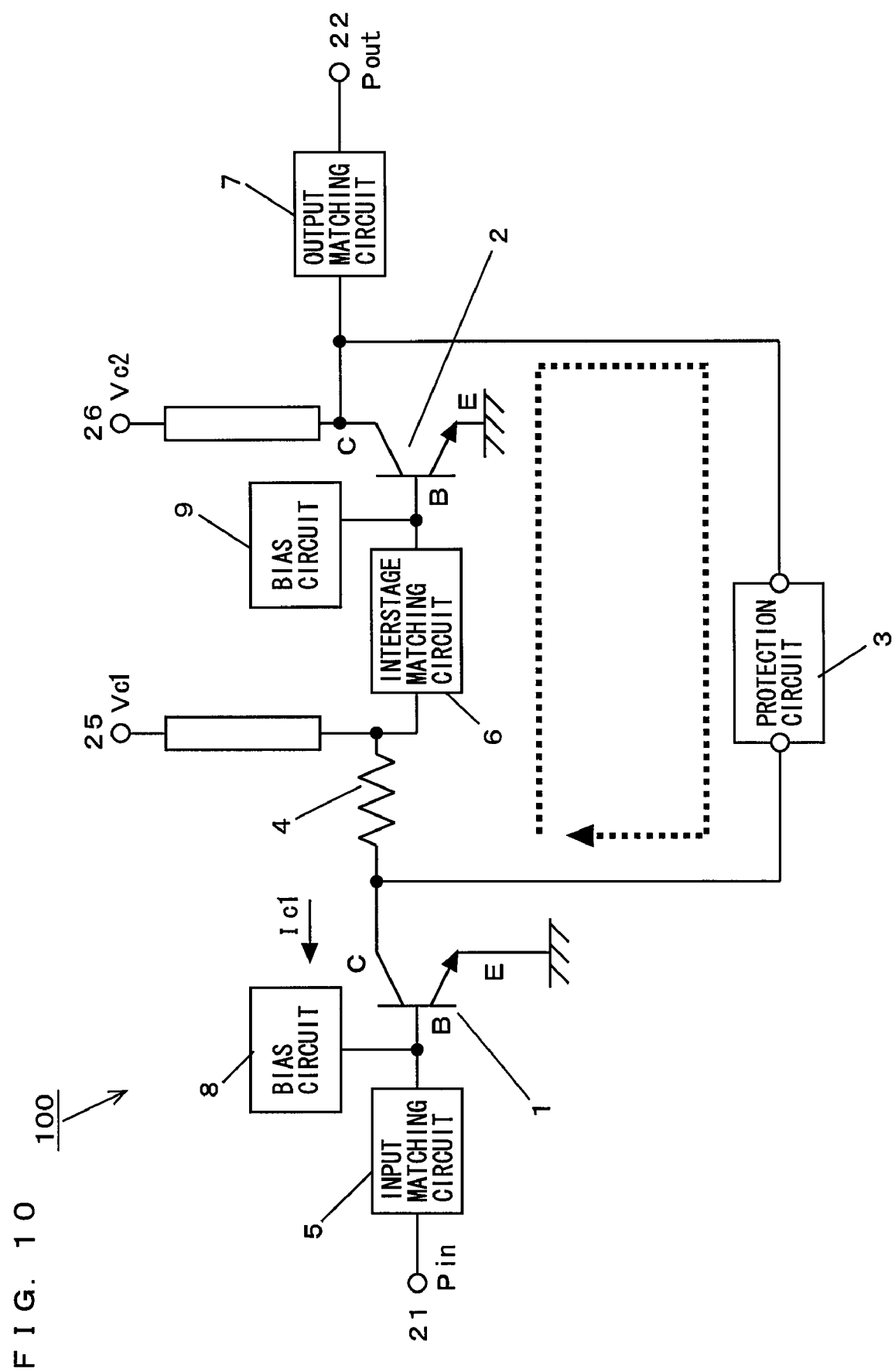
FIG. 10 is a diagram showing feedback of the radio-frequency signal in the radio-frequency power amplifier 100.
Figure 11:
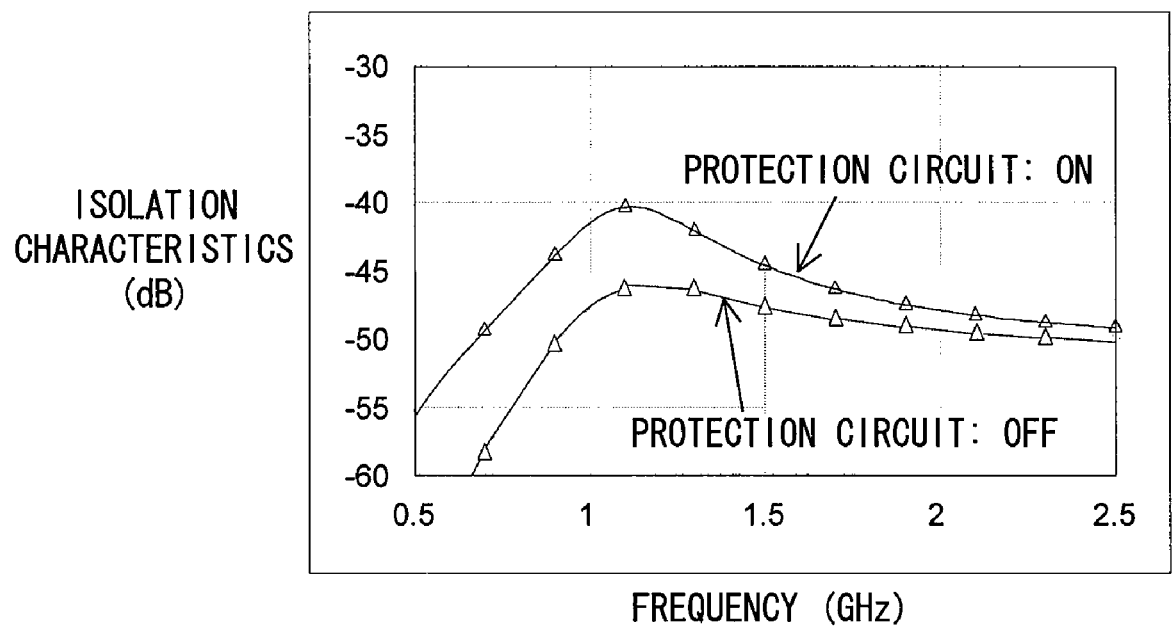
FIG. 11 is a diagram illustrating isolation characteristics of the radio-frequency power amplifier 100 in an on-state and an off-state of the protection circuit 3 which has the structure of (A) of FIG. 8.
Figure 12:
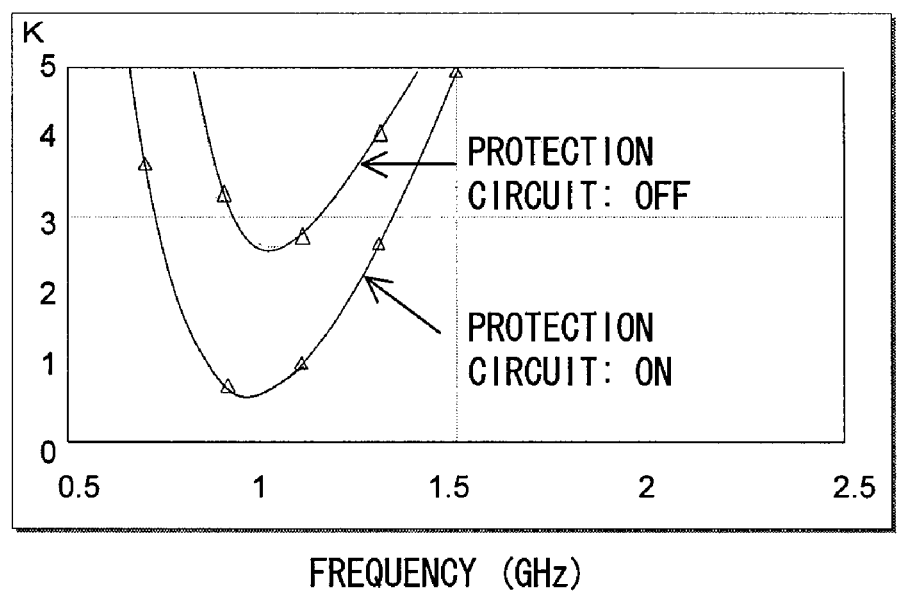
FIG. 12 is a diagram illustrating a stability factor (k) of the radio-frequency power amplifier 100 in the on-state and the off-state of the protection circuit 3 which has the structure of (A) of FIG. 8.

Note that in the on-state of the protection circuit 3 which has each structure of FIG. 8, the radio-frequency signal is fed back from the collector of the HBT 2 to the collector of the HBT 1 via the protection circuit 3 as shown in FIG. 10. Consequently, isolation characteristics of the radio-frequency power amplifier 100 deteriorate. FIG. 11 is a diagram illustrating the isolation characteristics of the radio-frequency power amplifier 100 in the on-state and off-state of the protection circuit 3 which has the structure of (A) of FIG. 8. As shown in FIG. 11, it is indicated that in the on-state of the protection circuit 3, the isolation characteristics deteriorate from those in the off-state of the protection circuit 3 by 7 dB at around the signal frequency of 0.9 GHz. FIG. 12 is a diagram illustrating a stability factor k of the radio-frequency power amplifier 100 in the on-state and off-state of the protection circuit 3 which has the structure of (A) of FIG. 8. As shown in FIG. 12, it is indicated that in the on-state of the protection circuit 3, the stability factor k is less than 1 at around the signal frequency of 0.9 GHz, and thus the stability of the radio-frequency power amplifier 100 deteriorates significantly. Note that it is possible to improve the above-described isolation characteristics and stability factor k by increasing the resistance values of the resistor 31 and the resistor 32. In this case, however, the effect of the present invention, which reduces the collector voltage of the HBT 1, is reduced, and thus it is not preferable.

Figure 13:
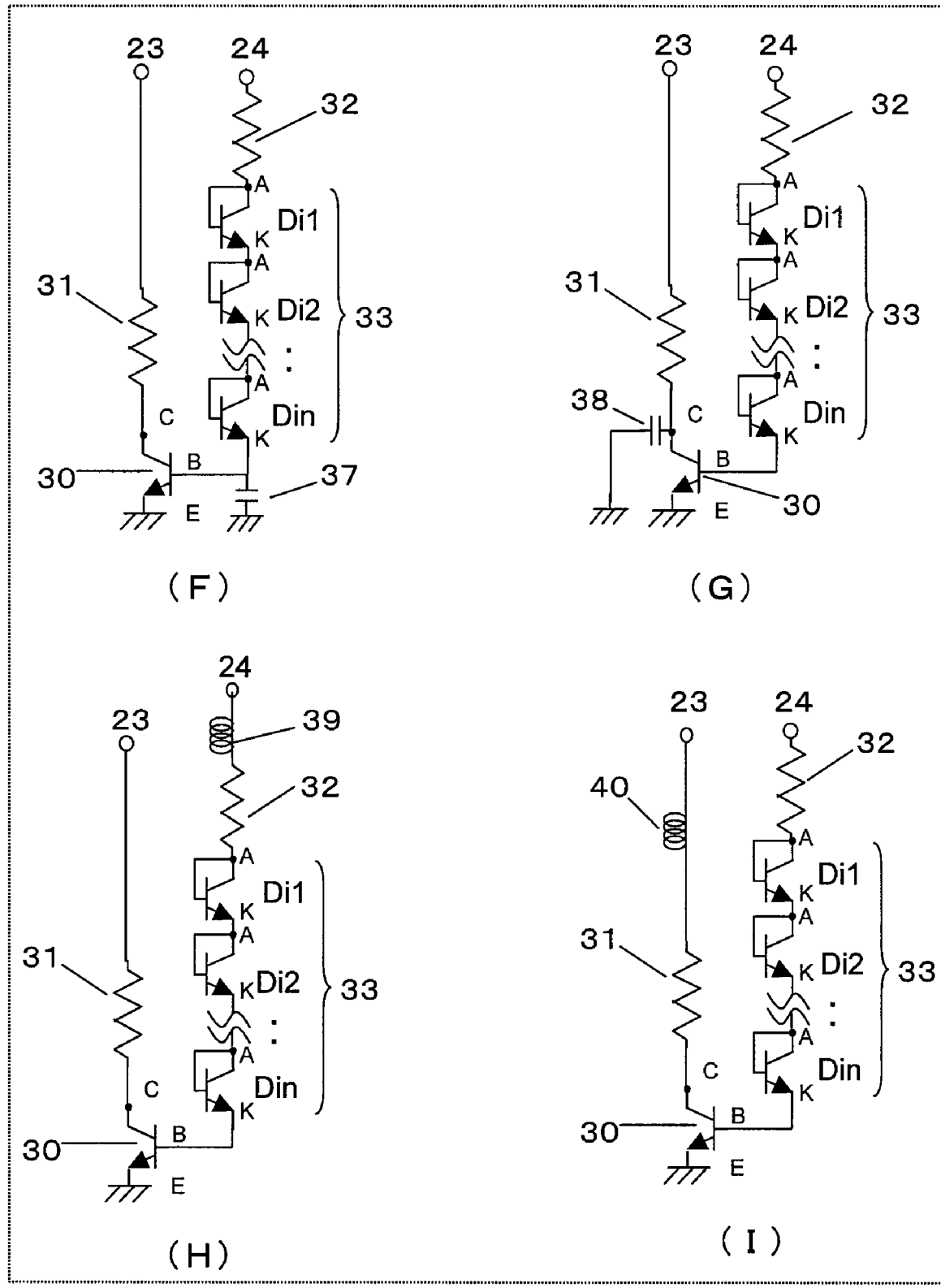
FIG. 13 is a diagram showing example structures of the protection circuit 3 of which the isolation characteristics and the stability factor (k) are improved.
Figure 14:
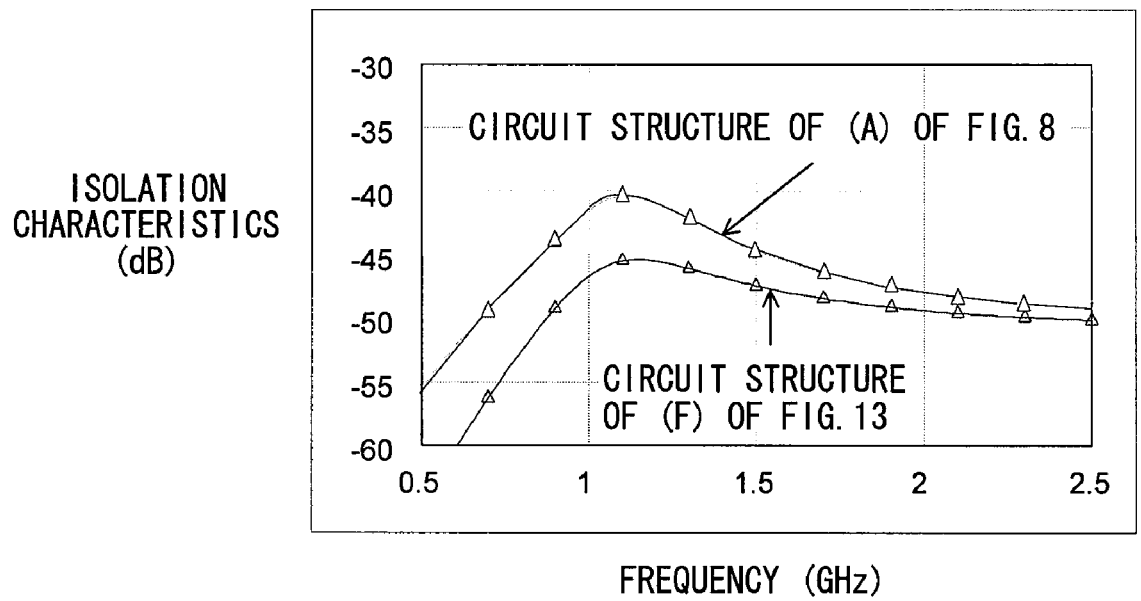
FIG. 14 is a diagram illustrating the isolation characteristics of the radio-frequency power amplifier 100 in the on-state of the protection circuit 3 which has the structure of (F) of FIG. 13 and the structure of (A) of FIG. 8.
Figure 15:
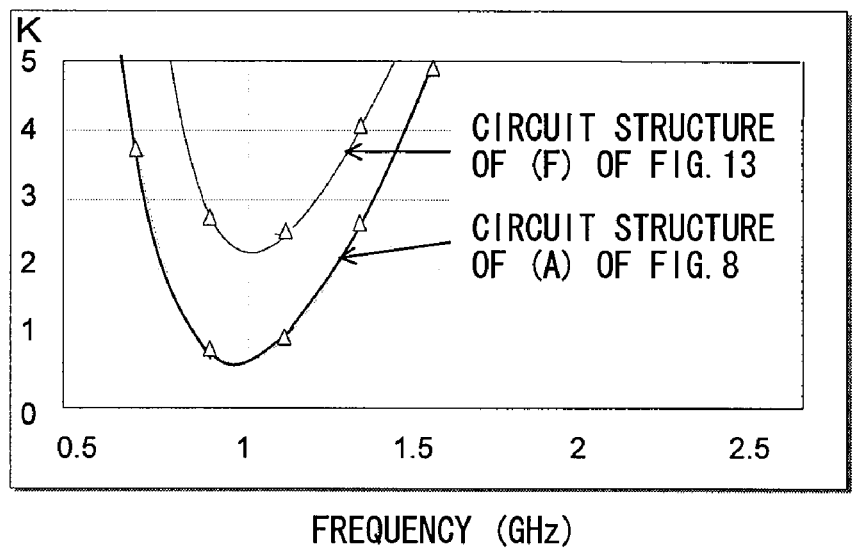
FIG. 15 is a diagram illustrating the stability factor (k) of the radio-frequency power amplifier 100 in the on-state of the protection circuit 3 which has the structure of (F) of FIG. 13 and the structure of (A) of FIG. 8.

FIG. 13 is a diagram showing example structures of the protection circuit 3 of which the isolation characteristics and the stability factor k are improved. The circuit of (F) of FIG. 13 has a structure in which a capacitor 37 parallel-connected to the base of the HBT 30 and having its one end connected to ground is added to the circuit structure of (A) of FIG. 8. FIG. 14 is a diagram illustrating the isolation characteristics of the radio-frequency power amplifier 100 in the on-state of the protection circuit 3 which has the structure of (F) of FIG. 13 and the structure of (A) of FIG. 8. As shown in FIG. 14, the isolation characteristics of the structure of (F) of FIG. 13 are improved from those of the structure of (A) of FIG. 8 and are so improved as to approximate those in the off-state of the protection circuit 3 (see FIG. 11). FIG. 15 is a diagram illustrating the stability factor k of the radio-frequency power amplifier 100 in the on-state of the protection circuit 3 which has the structure of (F) of FIG. 13 and the structure of (A) of FIG. 8. As shown in FIG. 15, the stability factor k of the structure of (F) of FIG. 13 is improved from that of the structure of (A) of FIG. 8 and is so improved as to approximate that in the off-state of the protection circuit 3 (see FIG. 12).

The circuit of (G) of FIG. 13 has a structure in which a capacitor 38 parallel-connected to the collector of the HBT 30 and having its one end connected to ground is added to the circuit structure of (A) of FIG. 8. This structure has the advantage of using a series circuit including the resistor 31 and the capacitor 38 for interstage matching in the radio-frequency power amplifier 100, as well as the above-described improvement of the isolation characteristics. The circuit of (H) of FIG. 13 has a structure in which an inductor 39 is provided between the detection terminal 24 and the resistor 32 of the circuit structure of (A) of FIG. 8. The circuit of (I) of FIG. 13 has a structure in which an inductor 40 is provided between the current input terminal 23 and the resistor 31 of the circuit structure of (A) of FIG. 8. These structures, unlike the structure using the capacitor 37 or the capacitor 38, can reduce noise received from the ground, as well as the above-described improvement of the isolation characteristics.

As described above, the radio-frequency power amplifier 100 according to the first embodiment of the present invention includes the protection circuit 3 for detecting the collector voltage of the HBT 2 and for controlling the collector voltage of the HBT 1 in accordance with the detected collector voltage. Consequently, in the overvoltage condition in which the collector voltage of the HBT 2 exceeds the rated voltage, the radio-frequency power amplifier 100 can sufficiently reduce the power outputted from the HBT 1 even in the case (at the time of excessive input) where the radio-frequency signal exceeding the rated power is inputted to the base of the HBT 1. As a result, the radio-frequency power amplifier 100 can prevent the HBT 2 from being destroyed, by sufficiently limiting the power inputted to the base of the HBT 2, even at the time of excessive input.

Second Embodiment

Figure 16:
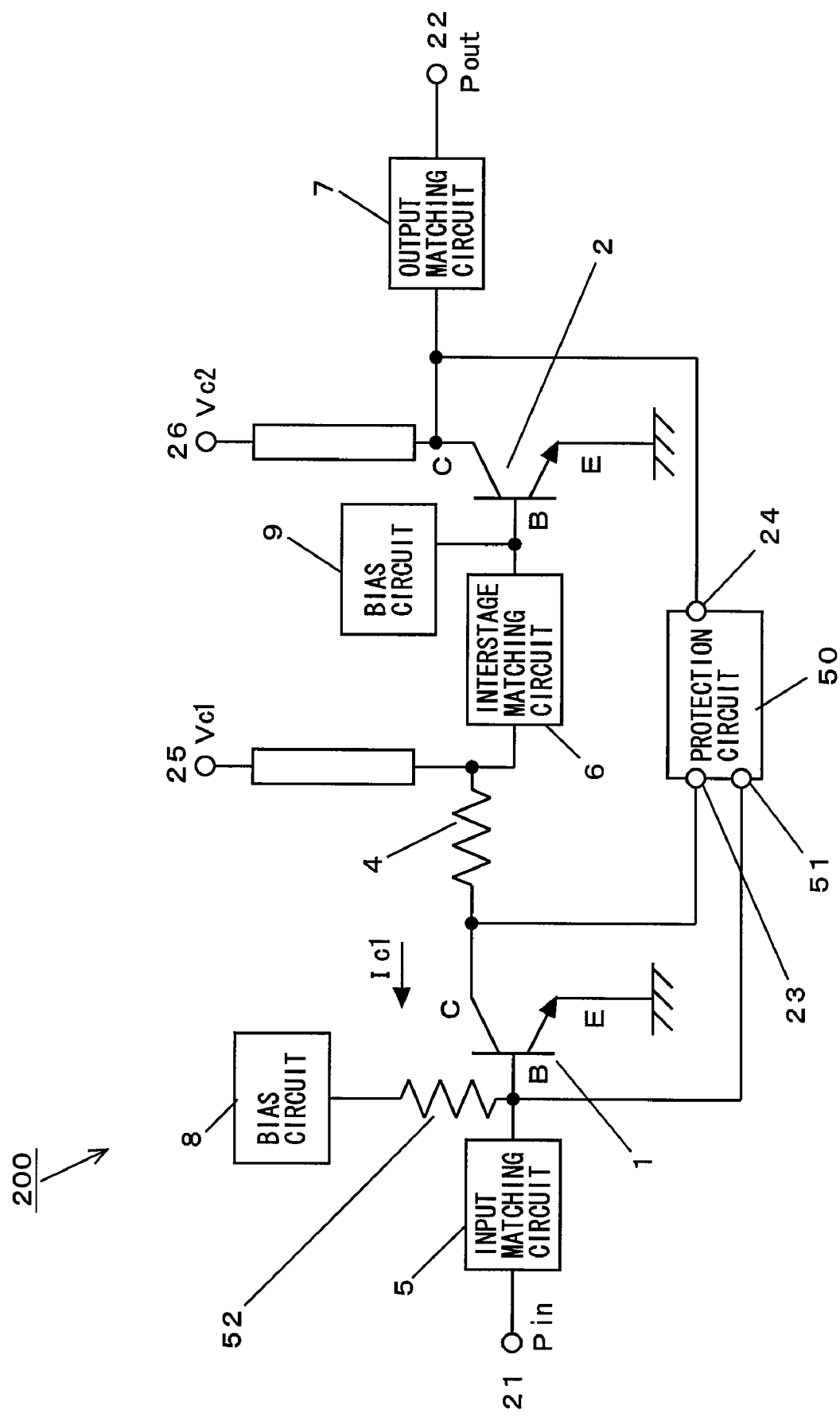
FIG. 16 is a diagram showing an example structure of a radio-frequency power amplifier 200 according to a second embodiment of the present invention.

FIG. 16 is a diagram showing an example structure of a radio-frequency power amplifier 200 according to a second embodiment of the present invention. As shown in FIG. 16, the radio-frequency power amplifier 200 has a structure in which a resistor 52 is added to the structure of the radio-frequency power amplifier 100 (see FIG. 1) according to the first embodiment and also a protection circuit 50 replaces the protection circuit 3 thereof. Note that in the radio-frequency power amplifier 200, the same elements as those of the radio-frequency power amplifier 100 are denoted by the same reference numerals, and therefore will not be described. The resistor 52 is provided between the bias circuit 8 and the base of the HBT 1. Similarly to the protection circuit 3, the protection circuit 50 includes the detection terminal 24, which is connected to the collector of the HBT 2, and also includes the current input terminal 23, which is connected to the collector of the HBT 1. The protection circuit 50 further includes a current input terminal 51, which is connected to the base of the HBT 1.

Similarly to the radio-frequency power amplifier 100, the radio-frequency power amplifier 200 reduces the collector voltage of the HBT 1 in accordance with the detected collector voltage of the HBT 2. Additionally, the radio-frequency power amplifier 200 reduces the base voltage of the HBT 1 by the same method (using the voltage drop caused by the resistor 52) as that (using the voltage drop caused by the resistor 4) used to reduce the collector voltage of the HBT 1 in accordance with the detected collector voltage of the HBT 2.

Figure 17:
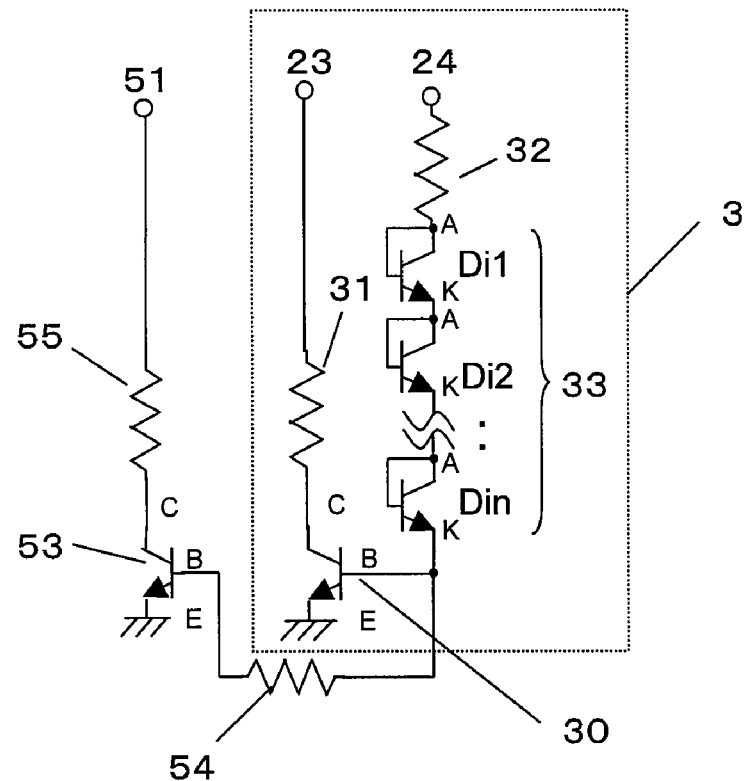
FIG. 17 is a diagram showing an example structure of a protection circuit 50.

FIG. 17 is a diagram showing an example structure of the protection circuit 50. As shown in FIG. 17, the protection circuit 50 has a structure in which an HBT 53, a resistor 54, and a resistor 55 are added to the structure of the protection circuit 3. Note that as an example, the structure of the protection circuit 3 included in the protection circuit 50 of FIG. 17 is the circuit structure of (A) of FIG. 8. However, the structure of the protection circuit 3 included in the protection circuit 50 may be any of the structures shown in FIG. 8 and FIG. 13. Further, in the protection circuit 50, the same elements as those of the protection circuit 3 are denoted by the same reference numerals, and therefore will be not described. The base of the HBT 53 is connected to the cathode terminal of the diode circuit 33 via the resistor 54. The emitter of the HBT 53 is connected to ground. The collector of the HBT 53 is connected to the current input terminal 51 via the resistor 55.

Figure 18:
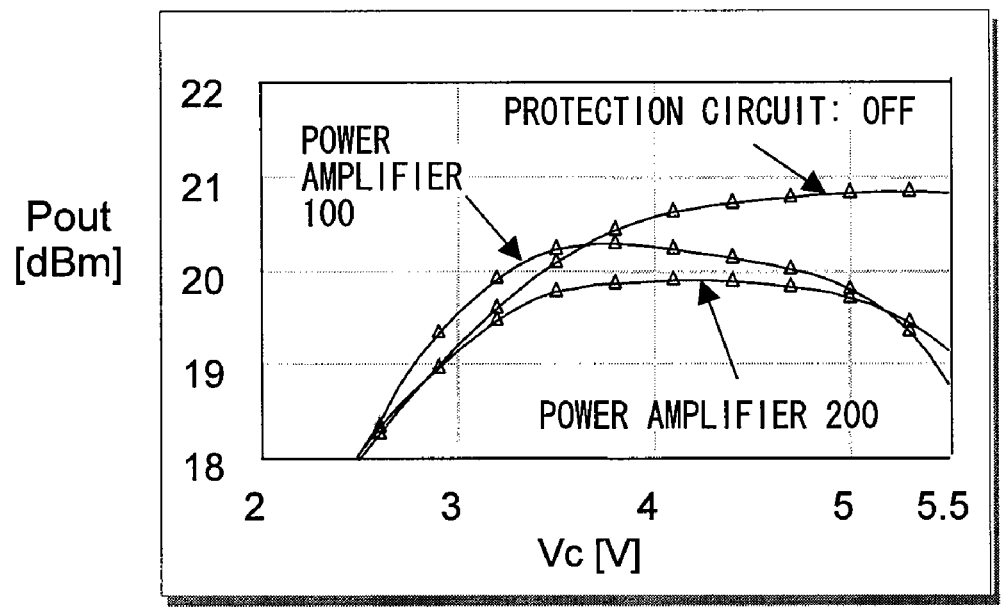
FIG. 18 is a diagram showing the output power of the HBT 2 in the radio-frequency power amplifier 100 of the first embodiment in the on-state of the protection circuit 3, that in the radio-frequency power amplifier 200 of the second embodiment in the on-state of the protection circuit 50, and that in the radio-frequency power amplifier 100 in the off-state of the protection circuit 3, in the case where the radio-frequency signal exceeding the rated power is inputted to the base of the HBT 1.

FIG. 18 is a diagram showing the output power of the HBT 2 in the radio-frequency power amplifier 100 of the first embodiment in the on-state of the protection circuit 3, that in the radio-frequency power amplifier 200 of the second embodiment in the on-state of the protection circuit 50, and that in the radio-frequency power amplifier 100 in the off-state of the protection circuit 3, in the case where the radio-frequency signal exceeding the rated power is inputted to the base of the HBT 1. Note that conditions such as a device size are the same as those described in FIG. 27. As shown in FIG. 18, the radio-frequency power amplifier 200 can stabilize the output power in a wider range of the collector voltage Vc of the HBT 2 than the radio-frequency power amplifier 100 does.

As described above, the radio-frequency power amplifier 200 according to the second embodiment of the present invention includes the protection circuit 50 for controlling the collector voltage of the HBT 1 in accordance with the detected collector voltage of the HBT 2 and for also controlling the base voltage of the HBT 1. Consequently, the radio-frequency power amplifier 200 can prevent, by limiting more of the power inputted to the base of the HBT 2 than the radio-frequency power amplifier 100 according to the first embodiment does, the HBT 2 from being destroyed even at the time of excessive input when the radio-frequency signal exceeding the rated power is inputted to the base of the HBT 1 in the overvoltage condition in which the collector voltage of the HBT 2 exceeds the rated voltage.

Figure 19:
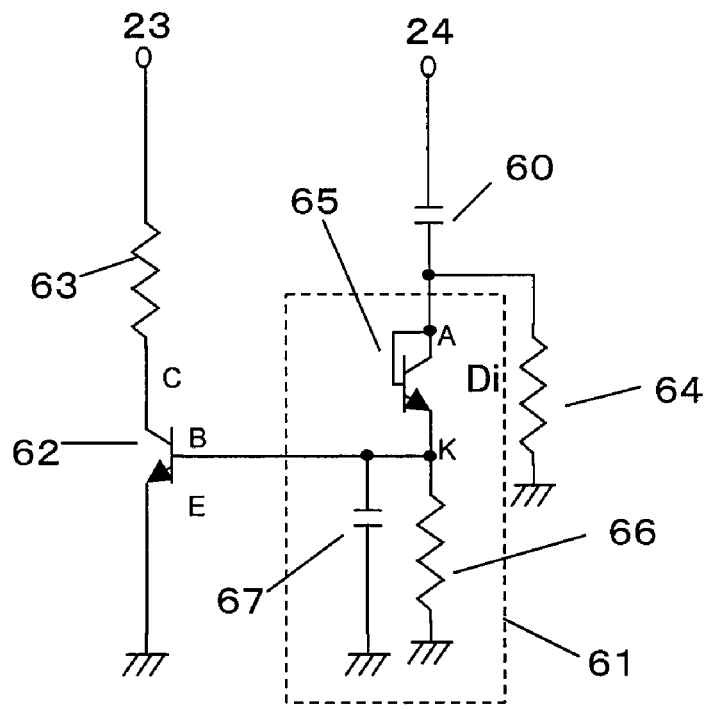
FIG. 19 is a diagram showing the protection circuit 3 used in the case of detecting power.
Figure 20:
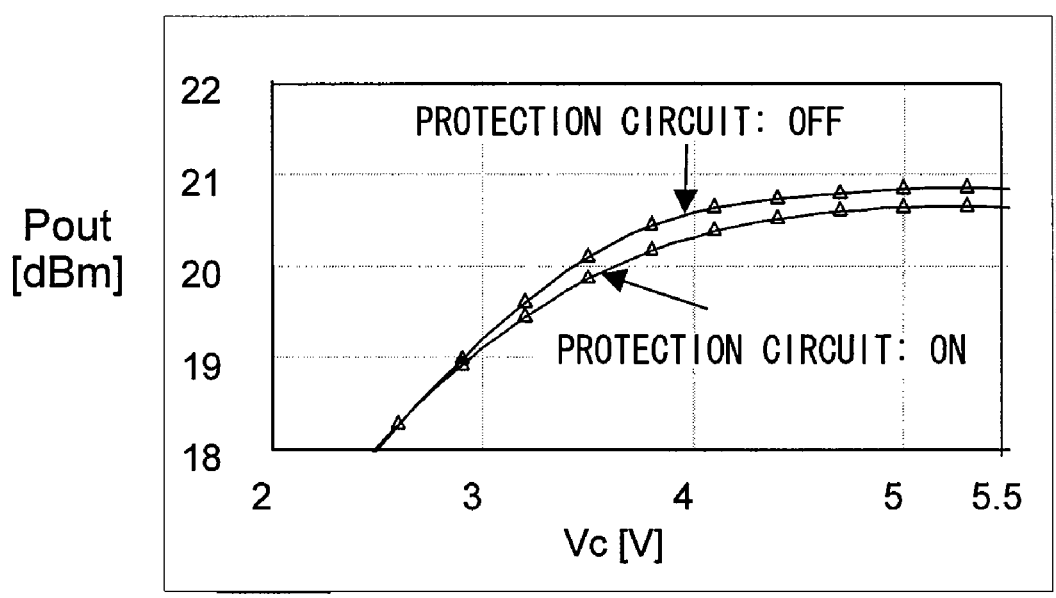
FIG. 20 is a diagram showing the output power of the HBT 2 in the on-state and the off-state of the protection circuit 3 used in the case of detecting power and shown in FIG. 19, in the case where the radio-frequency signal exceeding the rated power is inputted to the base of the HBT 1.
Figure 21:
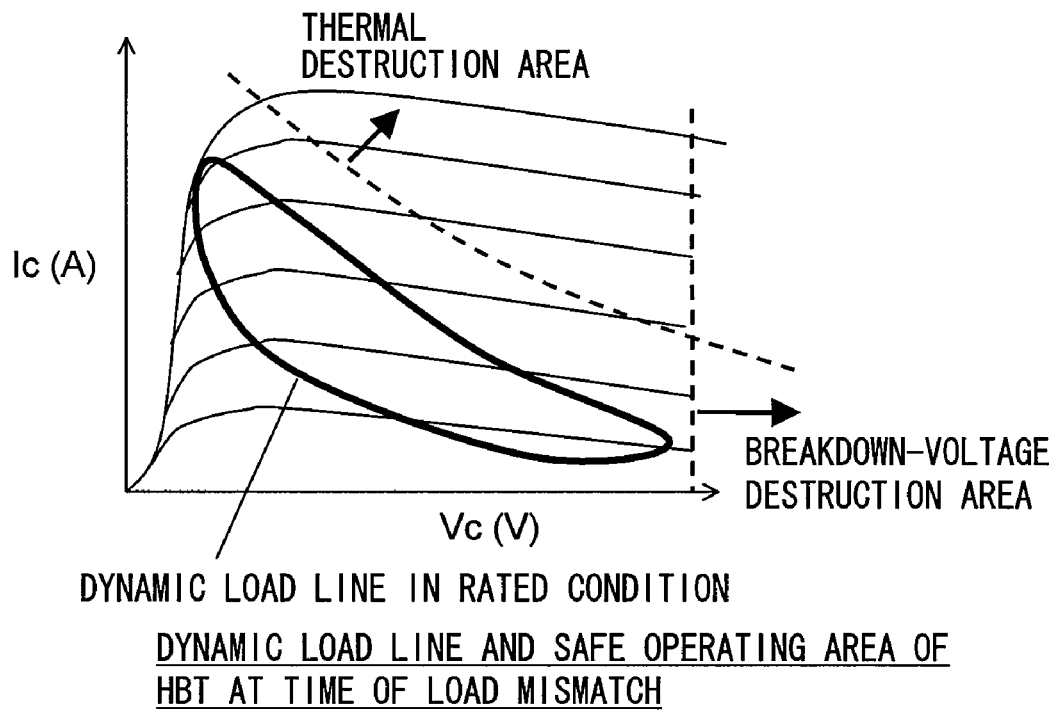
FIG. 21 is a general diagram showing a dynamic load line and a safe operating area at the time of load mismatch, of an HBT.
Figure 22:
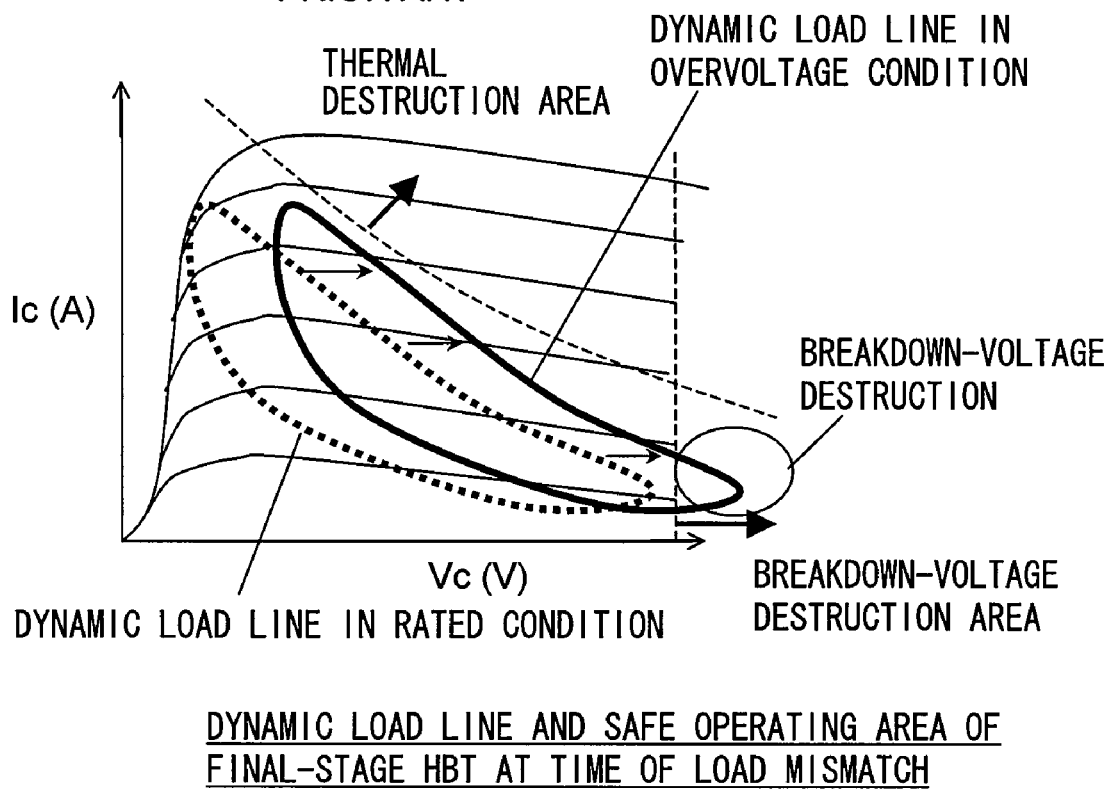
Figure 23:
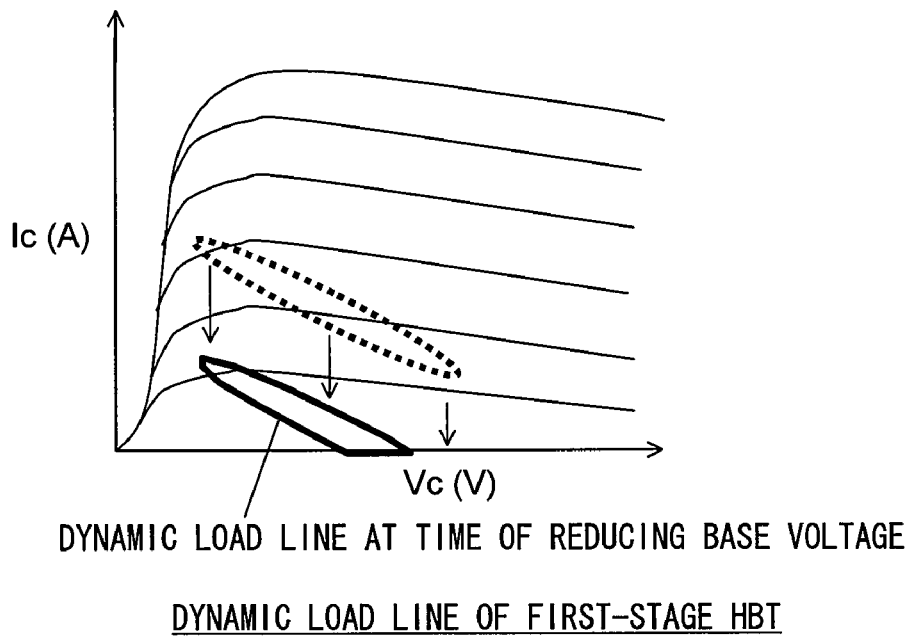
FIG. 23 is a diagram showing, in the case where the base voltage of a first-stage HBT of the multistage amplifier is reduced by a protection circuit, a dynamic load line of the first-stage HBT.
Figure 24:
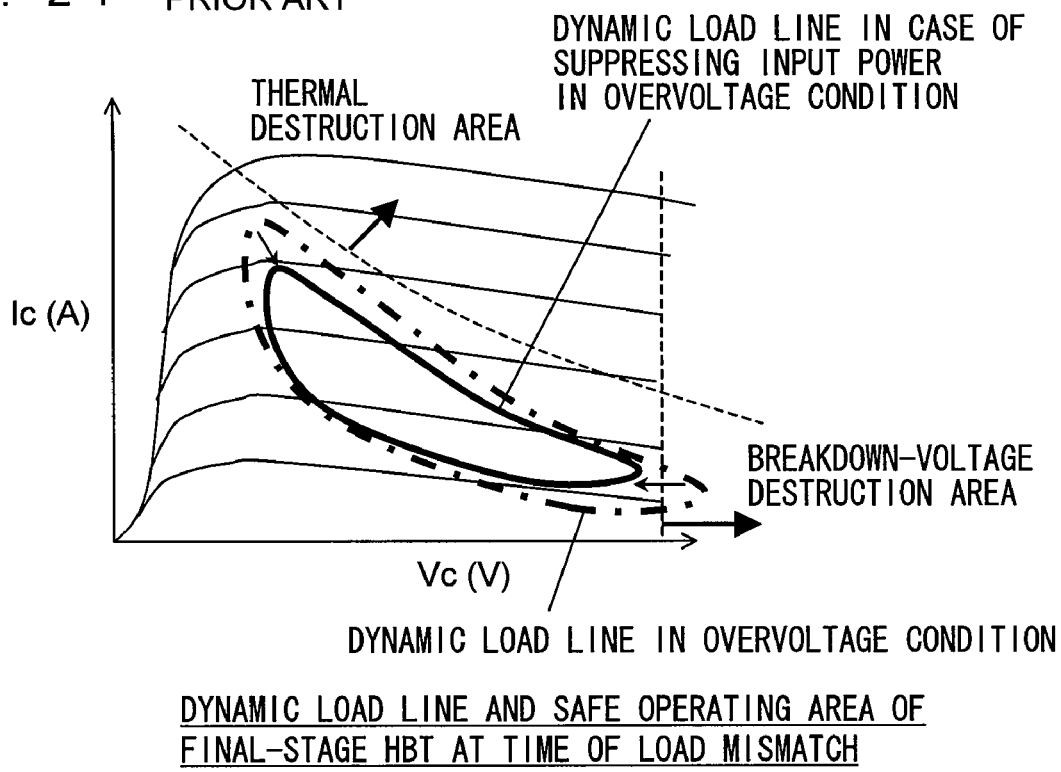
FIG. 24 is a diagram showing the dynamic load line at the time of load mismatch, of the final-stage HBT, in the case where, in an overvoltage condition, the base voltage of the first-stage HBT is reduced by the protection circuit and thus the input power to the final-stage HBT is reduced.
Figure 25:
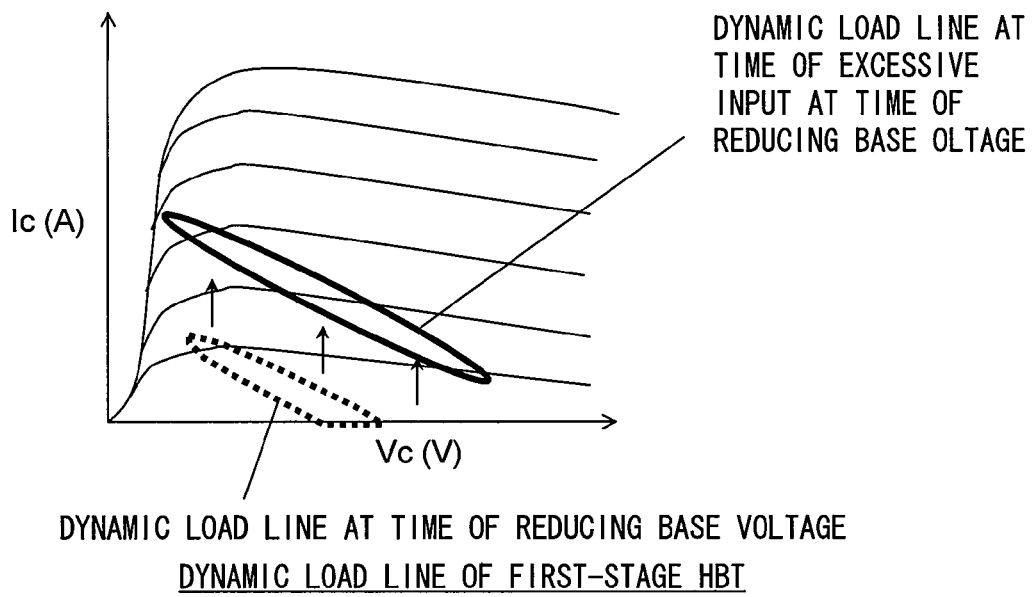
FIG. 25 is a diagram showing the dynamic load line of the first-stage HBT of which the base voltage is reduced by the protection circuit and to the base of which the radio-frequency signal exceeding the rated power is then inputted.
Figure 26:
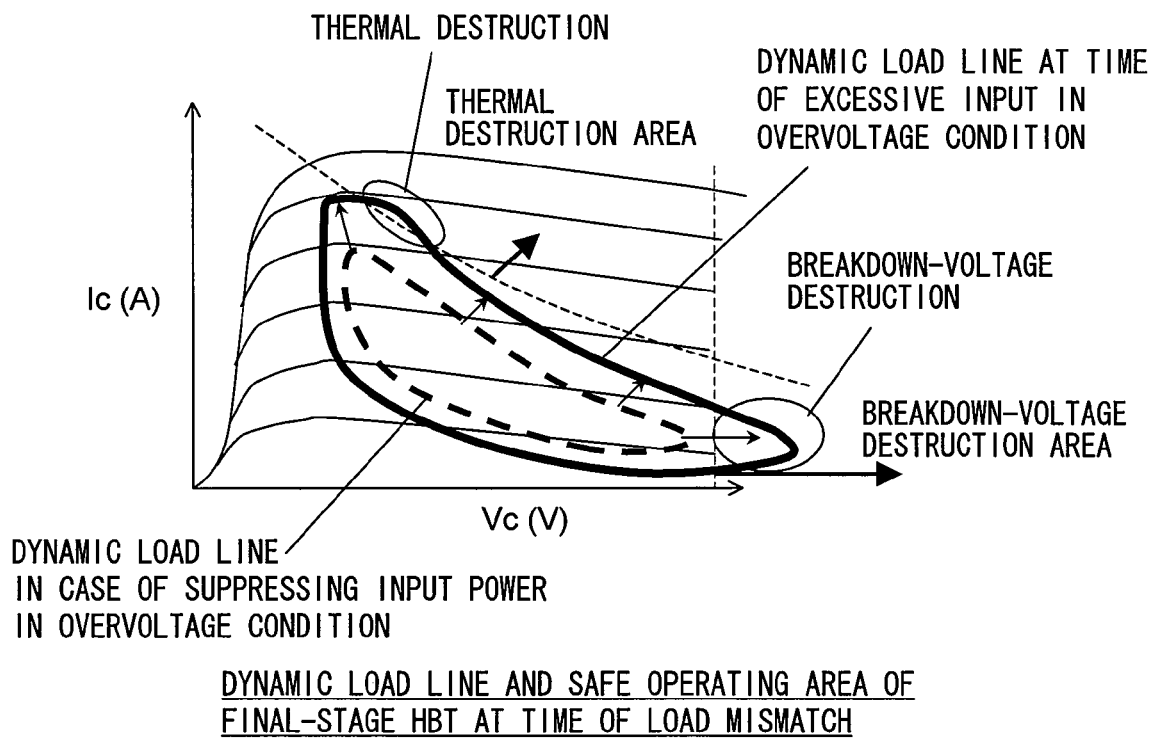
FIG. 26 is a diagram showing the dynamic load line at the time of load mismatch, of the final-stage HBT, in the case where the dynamic load line of the first-stage HBT shifts in the direction of increasing the collector current in FIG. 25.

Note that in the above-described embodiments, the voltage of the collector of the HBT 2 is detected, and thus the voltages of the collector and the like of the HBT 1 are controlled in accordance with the detected voltage. However, the power of the collector of the HBT 2 may be detected, and thus the voltages of the collector and the like of the HBT 1 may be controlled in accordance with the detected power. FIG. 19 is a diagram showing an example structure of the protection circuit 3 used in the case of detecting the power. As shown in FIG. 19, the protection circuit 3 used in the case of detecting the power includes a capacitor 60, a diode detector circuit 61, a resistor 64, an HBT 62, and a resistor 63. One end of the capacitor 60 is connected to the detection terminal 24 and the other end is connected to the input terminal of the diode detector circuit 61. The resistor 64 having its one end connected to ground is parallel-connected to the input terminal of the diode detector circuit 61. The base of the HBT 62 is connected to the output terminal of the diode detector circuit 61. The emitter of the HBT 62 is connected to ground. The collector of the HBT 62 is connected to one end of the resistor 63. The other end of the resistor 63 is connected to the current input terminal 23. The diode detector circuit 61 includes a diode 65, a resistor 66, and a capacitor 67. The anode of the diode 65 is connected to the input terminal of the diode detector circuit 61. The cathode of the diode 65 is connected to the output terminal of the diode detector circuit 61. The resistor 66 and the capacitor 67, each having its one end connected to ground, are parallel-connected to the cathode of the diode 65. FIG. 20 is a diagram showing the output power of the HBT 2 in the on-state and the off-state of the protection circuit 3 used in the case of detecting the power and shown in FIG. 19, in the case where the radio-frequency signal exceeding the rated power is inputted to the base of the HBT 1. As shown in FIG. 20, in the on-state of the protection circuit 3 used in the case of detecting the power, it is possible to stabilize the output power of the HBT 2 more than in the off-state.

Further, in each of the above-described embodiments, a two-stage power amplifier is used. The output from the final-stage amplification HBT is detected, and the operation of the first-stage amplification HBT is controlled. The invention can be applied to a multistage power amplifier of three or more stages. In this case, the output from the HBT of the second or later stage is detected, and the operation of another amplification HBT prior to the amplification HBT from which the output has been detected is controlled.

Further, as a diode included in the protection circuit 3 or in the protection circuit 50, a B-C short diode formed by connecting the base and the collector of an HBT may be used, or a Schottky barrier diode may be used.

Further, in the above-described embodiments, the input of the interstage matching circuit 6 is connected to the output of the resistor 4 and to the power supply voltage terminal 25, but may be connected to the collector of the HBT 1 and to the input of the resistor 4.

While the invention has been described in detail, the foregoing description is in all aspects illustrative and not restrictive. It is understood that numerous other modifications and variations can be devised without departing from the scope of the invention.

What is claimed is:

1. A radio-frequency multistage power amplifier using hetero bipolar transistors of which emitters are connected to ground, the radio-frequency multistage power amplifier comprising:
a first amplification stage including a first hetero bipolar transistor of which collector output is detected;
a second amplification stage which is prior to the first amplification stage and includes a second hetero bipolar transistor in which the detection result is reflected;
a first resistor provided between a collector of the second hetero bipolar transistor and a power supply; and
a protection circuit which is connected between a collector of the first hetero bipolar transistor and the collector of the second hetero bipolar transistor, detects output from the collector of the first hetero bipolar transistor, and reduces a voltage of the collector of the second hetero bipolar transistor in accordance with the detected output.

2. The radio-frequency multistage power amplifier according to claim 1,
wherein the protection circuit includes:
a diode circuit having an anode terminal connected to the collector of the first hetero bipolar transistor and also having a cathode terminal; and
a third hetero bipolar transistor of which a base is connected to the cathode terminal, a collector is connected to the collector of the second hetero bipolar transistor, and an emitter is connected to ground, and
wherein the protection circuit detects a voltage of the collector of the first hetero bipolar transistor.

3. The radio-frequency multistage power amplifier according to claim 2,
wherein the diode circuit has a plurality of diodes series-connected therein.

4. The radio-frequency multistage power amplifier according to claim 2,
wherein the protection circuit further includes:
a second resistor provided between the anode terminal and the collector of the first hetero bipolar transistor; and
a third resistor provided between the collector of the third hetero bipolar transistor and the collector of the second hetero bipolar transistor.

5. The radio-frequency multistage power amplifier according to claim 2,
wherein the protection circuit further includes
a capacitor of which one end is connected to the base or the collector of the third hetero bipolar transistor and the other end is connected to ground.

6. The radio-frequency multistage power amplifier according to claim 4,
wherein the protection circuit further includes
an inductor provided between the second resistor and the collector of the first hetero bipolar transistor or between the third resistor and the collector of the second hetero bipolar transistor.

7. The radio-frequency multistage power amplifier according to claim 2,
wherein the protection circuit further includes
a resistor of which one end is connected to the base of the third hetero bipolar transistor and the other end is connected to ground.

8. The radio-frequency multistage power amplifier according to claim 3,
wherein an anode and a cathode of any one of the plurality of diodes included in the diode circuit are connected by a resistor.

9. The radio-frequency multistage power amplifier according to claim 1, further comprising a second resistor provided between a base of the second hetero bipolar transistor and a bias power supply,
wherein the protection circuit is further connected to the base of the second hetero bipolar transistor and further reduces a voltage of the base of the second hetero bipolar transistor in accordance with the collector output.

10. The radio-frequency multistage power amplifier according to claim 9,
wherein the protection circuit includes:
a diode circuit having an anode terminal connected to the collector of the first hetero bipolar transistor and also having a cathode terminal;
a third hetero bipolar transistor of which a base is connected to the cathode terminal, a collector is connected to the collector of the second hetero bipolar transistor, and an emitter is connected to ground; and
a fourth hetero bipolar transistor of which a base is connected to the cathode terminal, a collector is connected to the base of the second hetero bipolar transistor, and an emitter is connected to ground, and
wherein the protection circuit detects a voltage of the collector of the first hetero bipolar transistor.

11. The radio-frequency multistage power amplifier according to claim 1,
wherein the protection circuit includes:
a first capacitor of which one end is connected to the collector of the first hetero bipolar transistor;
a diode detector circuit having an input terminal connected to the other end of the first capacitor and also having an output terminal, thereby converting power inputted from the input terminal into a voltage and outputting the voltage from the output terminal;
a third hetero bipolar transistor of which a base is connected to the output terminal of the diode detector circuit, a collector is connected to the collector of the second hetero bipolar transistor, and an emitter is connected to ground; and
a second resistor which is parallel-connected between the first capacitor and the input terminal of the diode detector circuit and of which one end is connected to ground, and
wherein the protection circuit detects power of the collector of the first hetero bipolar transistor.

12. The radio-frequency multistage power amplifier according to claim 11,
wherein the diode detector circuit includes:
a diode of which an anode is connected to the input terminal and a cathode is connected to the output terminal; and
a third resistor and a second capacitor, each of which is parallel-connected between the cathode of the diode and the output terminal and of each of which one end is connected to ground.

13. The radio-frequency multistage power amplifier according to claim 12,
wherein the protection circuit further includes a fourth resistor between the collector of the third hetero bipolar transistor and the collector of the second hetero bipolar transistor.

* * * * *